US007332742B2

(12) United States Patent
Miyake et al.

(10) Patent No.: US 7,332,742 B2
(45) Date of Patent: Feb. 19, 2008

(54) DISPLAY DEVICE AND ELECTRONIC APPARATUS

(75) Inventors: Hiroyuki Miyake, Kanagawa (JP); Ryota Fukumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 232 days.

(21) Appl. No.: 11/167,659

(22) Filed: Jun. 28, 2005

(65) Prior Publication Data

US 2006/0007218 A1 Jan. 12, 2006

(30) Foreign Application Priority Data

Jun. 29, 2004 (JP) ............................ 2004-192157

(51) Int. Cl.
*H01L 29/04* (2006.01)

(52) U.S. Cl. .......................... 257/59; 257/83; 257/290; 257/351; 257/E27.108

(58) Field of Classification Search .................. 257/72, 257/59, 83, 290, 351
See application file for complete search history.

(56) References Cited

U.S. PATENT DOCUMENTS

| | | | |
|---|---|---|---|
| 5,247,190 A | 9/1993 | Friend et al. | |
| 5,399,502 A | 3/1995 | Friend et al. | |
| 5,615,027 A | 3/1997 | Kuribayashi et al. | |
| 5,990,629 A | 11/1999 | Yamada et al. | |
| 6,583,775 B1 | 6/2003 | Sekiya et al. | |
| 6,730,966 B2 | 5/2004 | Koyama | |
| 7,012,278 B2 * | 3/2006 | Kimura et al. | 257/79 |
| 2001/0002703 A1 | 6/2001 | Koyama | |
| 2001/0022565 A1 | 9/2001 | Kimura | |
| 2002/0044109 A1 | 4/2002 | Kimura | |
| 2002/0113760 A1 | 8/2002 | Kimura | |
| 2002/0196389 A1 | 12/2002 | Koyama | |
| 2003/0090447 A1 | 5/2003 | Kimura | |

(Continued)

FOREIGN PATENT DOCUMENTS

EP 1 107 220 A2 6/2001

(Continued)

OTHER PUBLICATIONS

Baldo et al., M.A.; "Highly efficient phosphorescent emission from organic electroluminescent devices"; *Letters to Nature*, vol. 395; pp. 151-154; 1998.

(Continued)

*Primary Examiner*—Wai-Sing Louie
(74) *Attorney, Agent, or Firm*—Fish & Richardson P.C.

(57) ABSTRACT

The invention provides a display device in which occurrence of a display defect called a ghost is prevented, and a driving method thereof, and a television set. According to the invention, a gate control signal (GWE) which has been one signal is divided into a first gate control signal (GWE1) and a second gate control signal (GWE2), or a pulse-width control signal (PWC) is used in addition to one gate control signal (GWE) which has been used, thereby preventing a period for outputting a video signal to a pixel by a source driver and a period for selecting a gate line by an erasing gate driver from overlapping each other. Then, video signal writing to a pixel where an erasing operation is performed is prevented, so that occurrence of the display defect called a ghost is prevented.

16 Claims, 16 Drawing Sheets

U.S. PATENT DOCUMENTS

| | | | |
|---|---|---|---|
| 2003/0164685 A1 | 9/2003 | Inukai | |
| 2003/0209989 A1 | 11/2003 | Anzai et al. | |
| 2003/0222589 A1 | 12/2003 | Osame et al. | |
| 2005/0205880 A1* | 9/2005 | Anzai et al. | 257/83 |

FOREIGN PATENT DOCUMENTS

| | | |
|---|---|---|
| JP | 10-092576 | 4/1998 |
| JP | 11-176521 | 7/1999 |
| JP | 2001-324958 | 11/2001 |
| JP | 2002-149112 | 5/2002 |
| JP | 2002-175047 | 6/2002 |
| JP | 2002-278497 | 9/2002 |
| JP | 2002-323873 | 11/2002 |
| JP | 2002-358031 | 12/2002 |
| JP | 2003-058107 | 2/2003 |
| JP | 2003-323159 | 11/2003 |
| WO | WO 90/13148 A1 | 11/1990 |
| WO | WO 03/27997 A1 | 4/2003 |

OTHER PUBLICATIONS

Baldo et al., M.A.; "Very high-efficiency green organic light-emitting devices based on electrophosphorescence"; *Applied Physics Letters*, vol. 75, No. 1; pp. 4-6; 1999.

Han et al., Chang Wook; "Green OLED with low temperature poly Si TFT"; *EuroDisplay '99*; pp. 27-30; 1999.

Inukai et al., Kazutaka; "4.0-in. TFT-OLED Displays and a Novel Digital Driving Method"; *SID '00 Digest*, pp. 924-927; 2000.

Kimura et al., Mutsumi; "TFT-LEPD with Image Uniformity by Area Ratio Gray Scale"; *EuroDisplay '99*; pp. 71-74; 1999.

Kimura et al.; "Low Temperature Poly-Si TFT Driven Light-Emitting-Polymer Display and Digital Gray Scale for Uniformity"; *IDW 99*; pp. 171-174; 1999.

Mizukami et al., Mayumi; "6-Bit Digital VGA OLED"; *SID 00 Digest*; pp. 912-915; 2000.

Schenk et al., Hermann; "Polymers for Light Emitting Diodes"; *EuroDisplay '99*; pp. 33-37; 1999.

Shimoda et al., Tatsuya; "High Resolution Light Emitting Polymer Display Driven by Low Temperature Polysilicon Thin Film Transistor with Integrated Driver"; *Asia Display 98*; pp. 217-220; 1998.

Shimoda et al.; "Current Status and Future of Light-Emitting Polymer Display Driven by Poly-Si TFT"; *SID 99 Digest*; pp. 372-375; 1999.

Shimoda et al.; "Technology for Active Matrix Light Emitting Polymer Displays"; *IEDM 99*; pp. 107-110; 1999.

Tsutsui et al., Tetsuo; "Electroluminescence in Organic Thin Films"; *Photochemical Processes in Organized Molecular Systems*; pp. 437-450; 1991.

Tsutsui et al., Tetsuo; "High Quantum Efficiency in Organic Light-Emitting Devices with Iridium-Complex as a Triplet Emissive Center"; *Japanese Journal of Applied Physics*, vol. 38, Part 2, No. 12B; pp. L1502-L1504; 1999.

* cited by examiner 9201
9202
CG Silicon 9702
9701

9102
9101

9302
9301

9402
9401

9502
9501

DISPLAY DEVICE AND ELECTRONIC APPARATUS

BACKGROUND OF THE INVENTION

1. Field of the Invention

The present invention relates to a display device comprising a light-emitting element, a driving method thereof, and a television set.

In addition, the invention relates to an electronic apparatus provided with the display device comprising a light-emitting element.

2. Description of the Related Art

In recent years, a display device comprising a light-emitting element typified by an EL (Electro Luminescence) element has been developed, which is expected to be widely used taking advantage of the self-luminous type such as high image quality, wide viewing angle, thin type, and light weight.

There is an application having an object to solve a problem of lack of luminance and the like, which is due to decrease in the duty ratio (the ratio of a light-emitting period to a period including the light-emitting period and a non light-emitting period), by employing novel driving method and circuit in the display device comprising a light-emitting element (see Patent Document 1). According to Patent Document 1, a signal is written to pixels at a plurality of rows within one gate signal line selecting period. Therefore, in pixels at any row, a period from a signal is inputted until a next signal is inputted can be set arbitrarily to some extent with a sufficient writing period to the pixels, so that a sustain (light-emitting) period is arbitrarily set and the high duty ratio is realized. In addition, there is an application to provide a method for performing multi-gray scale display of an electro-optic device by a time gray scale method without providing a reset line (see Patent Document 2).

[Patent Document 1] Japanese Patent Laid-Open No. 2001-324958

[Patent Document 2] Japanese Patent Laid-Open No. 2002-175047

When employing the driving methods described in Patent Documents 1 and 2, a display defect which is called a ghost may occur. The ghost is such a phenomenon that when an image (here a white box) is displayed in the middle of a display screen for example, the same image is also displayed in the above and below (see FIG. 15). The display defect which is called a ghost is caused by an overlap period (denoted by Tk in the drawing) between a period for outputting a video signal to a pixel by a source driver and a period for selecting a gate line (here the i-th row gate line) by an erasing second gate driver occurs so that video signal is written to a pixel where an erasing operation is performed (see FIG. 16).

SUMMARY OF THE INVENTION

In view of the foregoing, it is an object of the invention to provide a display device in which occurrence of the display defect called a ghost is prevented, a driving method thereof, and a television set.

According to the invention, a gate control signal (GWE) which has been one signal is divided into a first gate control signal (GWE1) and a second gate control signal (GWE2) so as to prevent a period for outputting a video signal to a pixel by a source driver and a period for selecting a gate line by an erasing gate driver from overlapping each other. Then, video signal writing to a pixel where an erasing operation is performed is prevented, thereby occurrence of the display defect called a ghost is prevented.

According to the invention, a pulse-width control signal (PWC) is used in addition to one gate control signal (GWE) which has been used so as to prevent a period for outputting a video signal to a pixel by a source driver and a period for selecting a gate line by an erasing gate driver from overlapping each other. Then, video signal writing to a pixel where an erasing operation is performed is prevented, thereby occurrence of the display defect called a ghost is prevented.

A display device of the invention comprises a pixel region including a plurality of pixels, a source driver, a first gate driver, a second gate driver, and a control signal generating circuit. Each of the plurality of pixels includes a light-emitting element, a switching transistor for controlling video signal input to the pixel (a first transistor), a driving transistor for controlling whether the light-emitting element emits light or not (a second transistor), and a capacitor for holding a video signal. The source driver includes a pulse output circuit, a latch circuit, and a selection circuit which operates based on a source control signal outputted from the control signal generating circuit.

Each of the first gate driver and the second gate driver includes a pulse output circuit, and a buffer circuit which operates based on a first gate control signal and a second gate control signal outputted from the control signal generating circuit.

Alternatively, each of the first gate driver and the second gate driver includes a pulse output circuit, and a buffer circuit which operates based on a gate control signal and a pulse-width control signal outputted from the control signal generating circuit.

According to the display device comprising the above structure, the buffer circuit has at least three input nodes and one output node. Among the three input nodes, one is connected to the pulse output circuit, one is connected to the control signal generating circuit via a first gate control signal line, and the other one is connected to the control signal generating circuit via a second gate control signal line. The output node is connected to a gate line.

Alternatively, according to the display device comprising the above structure, one of three input nodes of the buffer circuit is connected to the pulse output circuit, one is connected to a gate control signal line, and the other one is connected to a pulse-width control signal line. An output node thereof is connected to a gate line.

According to the invention, a pixel region including a plurality of pixels, a source driver, a first gate driver, a second gate driver, and a control signal generating circuit are included. One frame period includes a writing period and a light-emitting period. The writing period includes a plurality of gate selecting periods each of which includes a first sub-gate selecting period and a second sub-gate selecting period.

In the first sub-gate selecting period, based on the first gate control signal and the second gate control signal, or the gate control signal and the pulse-width control signal which are transmitted from the control signal generating circuit, the buffer circuit in the first gate driver becomes the active state whereas the buffer circuit in the second gate driver becomes the high-impedance state, and thereby the buffer circuit in the first gate driver selects a first gate line. Meanwhile, based on the source control signal transmitted from the control signal generating circuit, the source driver outputs a video signal to pixels each including a transistor connected to the first gate line.

In the second sub-gate selecting period, based on the first gate control signal and the second gate control signal, or the gate control signal and the pulse-width control signal which are transmitted from the control signal generating circuit, the buffer circuit in the first gate driver becomes the high-impedance state whereas the buffer circuit in the second gate driver becomes the active state, and thereby the buffer circuit in the second gate driver selects a second gate line. Meanwhile, based on the source control signal transmitted from the control signal generating circuit, the source driver outputs an erasing signal to pixels each including a transistor connected to the second gate line.

In this manner, a period for outputting a video signal by the source driver and a period for selecting the second gate line do not overlap each other.

It is to be noted that the high-impedance state means a state in which an output of the circuit is not electrically connected. The active state means a state opposite to the high-impedance state, namely a state in which an output of the circuit is electrically connected.

According to the invention comprising the above-described structure, the occurrence of the display defect called a ghost can be prevented.

DETAILED DESCRIPTION OF THE INVENTION

Figure 1:
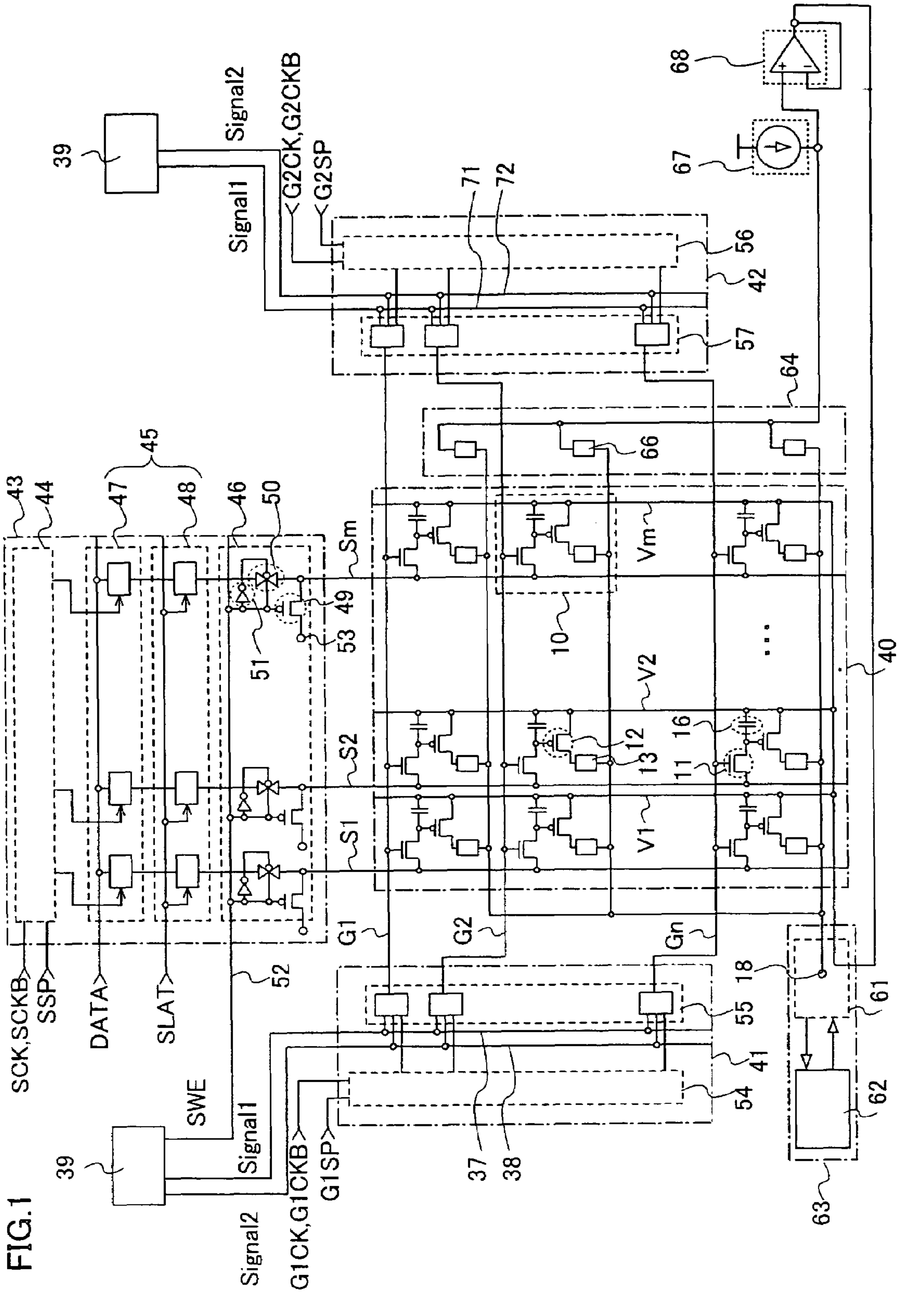
FIG. 1 is a diagram showing a configuration of the display device.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be construed as being included therein. It is to be noted that the same portion is denoted by the same reference numeral in different drawings in a structure of the invention described hereinafter.

Embodiment Mode 1

A display device of the invention comprises a pixel region 40 in which a plurality of pixels 10 are provided in matrix, a first gate driver 41, a second gate driver 42, and a source driver 43 (see FIG. 1). The first gate driver 41 and the second gate driver 42 are provided so as to face each other across the pixel region 40, or provided on one of the left, right, above and below of the pixel region 40.

The display device of the invention further comprises a control signal generating circuit 39 for generating a source control signal (SWE), a first control signal (Signal1), and a second control signal (Signal2).

As for the signals generated by the control signal generating circuit 39, specifically, there are the following two cases: a case where the first control signal (Signal1) is a first gate control signal (GWE1 and GWE1B, providing GWE1B is an inverted signal of GWE1) and the second control signal (Signal2) is a second gate control signal (GWE2 and GWE2B, providing GWE2B is an inverted signal of GWE2), and a case where the first control signal (Signal1) is a gate control signal (GWE and GWEB, providing GWEB is an inverted signal of GWE) and the second control signal (Signal2) is a pulse-width control signal (PWC).

In the case where the first control signal is the first gate control signal (GWE1 and GWE1B) and the second control signal is the second gate control signal (GWE2 and GWE2B), the control signal generating circuit 39 outputs GWE1 through a first control signal line 37, GWE2 through a second control signal line 38, GWE1B (an inverted signal of GWE1) through a first control signal line 71, and GWE2B (an inverted signal of GWE2) through a second control signal line 72. Alternatively, the control signal generating circuit 39 outputs GWE1B through the first control signal line 37, GWE2B through the second control signal line 38, GWE1 through the first control signal line 71, and GWE2 through the second control signal line 72.

In those two cases, the first control signal lines 37 and 71 may each be called a first gate control signal line whereas the second control signal lines 38 and 72 may each be called a second gate control signal line. In addition, GWE1 and GWE1B are collectively called a first gate control signal whereas GWE2 and GWE2B are collectively called a second gate control signal. It is to be noted that, by providing an inverter at the first control signal line 37 and the second control signal line 38, or at the first control signal line 71 and the second control signal line 72, the same signal (that is GWE1 or GWE1B) may be outputted to the first control signal lines 37 and 71 and the same signal (that is GWE2 or GWE2B) may be outputted to the second control signal lines 38 and 72.

In the case where the first control signal is the gate control signal (GWE) and the second control signal is the pulse-width control signal (PWC), the control signal generating circuit 39 outputs GWE through the first control signal line 37, PWC through the second control signal line 38, GWEB (an inverted signal of GWE) through the first control signal line 71, and PWC through the second control signal line 72. Alternatively, the control signal generating circuit 39 outputs GWEB through the first control signal line 37, PWC through the second control signal line 38, GWE through the first control signal line 71, and PWC through the second control signal line 72.

In those two cases, the first control signal lines 37 and 71 may each be called a gate control signal line whereas the second control signal lines 38 and 72 may each be called a pulse-width control signal line. In addition, GWE and GWEB are collectively called a gate control signal. It is to be noted that, by providing an inverter at the first control signal line 37 or 71, the same signal (that is GWE or GWEB) may be outputted to the first control signal lines 37 and 71.

The pixel 10 includes a plurality of elements at a region where a source line Sx (x is a positive integer, satisfying $1 \leqq x \leqq m$) intersects a gate line Gy (y is a positive integer, satisfying $1 \leqq y \leqq n$) with an insulator interposed therebetween. In addition, the pixel 10 includes a light-emitting element 13, a capacitor 16, and two transistors. One of the two transistors is a switching transistor 11 for controlling video signal input to the pixel 10 and the other is a driving transistor 12 for controlling whether the light-emitting element 13 emits light or not. Both of the switching transistor 11 and the driving transistor 12 are field-effect transistors each having three terminals of a gate electrode, a source electrode, and a drain electrode.

The gate electrode of the switching transistor 11 is connected to the gate line Gy, one of the source electrode and the drain electrode thereof is connected to the source line Sx, and the other is connected to the gate electrode of the driving transistor 12. One of the source electrode and the drain electrode of the driving transistor 12 is connected to a power supply line Vx (x is a positive integer, satisfying $1 \leqq x \leqq m$), and the other is connected to a pixel electrode of the light-emitting element 13. A counter electrode of the light-emitting element 13 is connected to a counter power supply 18. The capacitor 16 is provided between the gate electrode and the source electrode of the driving transistor 12.

One of the source electrode and the drain electrode of the driving transistor 12 is kept at a constant potential. In addition, the counter electrode of the light-emitting element 13, which is connected to the counter power supply 18 through a wiring, is kept at a constant potential.

The conductivity type of each of the switching transistor 11 and the driving transistor 12 is not limited, and either an n-type (n-channel type) or a p-type (p-channel type) can be employed; the switching transistor 11 is an n-type and the driving transistor 12 is a p-type in the configuration shown in the drawing. Although the potential of each of the power supply line Vx and the counter power supply 18 is not limited as well, they have different potentials from each other such that a forward-bias voltage or a reverse-bias voltage is applied to the light-emitting element 13.

According to the display device of the invention having the above-described configuration, the number of transistors provided in the pixel 10 is two. According to the above-described characteristic, the number of transistors to be laid out in one pixel 10 can be reduced, and the number of wirings to be provided can naturally be reduced as the number of the transistors is reduced, thereby high opening ratio, high precision, and high yield are realized. In addition, when the high opening ratio is realized, the luminance of the light-emitting element corresponding to a voltage can be decreased as the area to emit light increases. That is, the current density of the light-emitting element corresponding to a voltage can be decreased. Therefore, since the driving voltage of a display device can be reduced, the power consumption of the display device can be reduced. Furthermore, by decreasing the driving voltage of the display device, the reliability of the light-emitting element 13 can be improved.

According to the display device of the invention, the driving transistor 12 operates in the linear region. According to the above characteristic, as compared to the case of being operated in the saturation region, the driving voltage of the display device itself can be reduced, and therefore, the power consumption can be reduced.

The switching transistor 11 and the driving transistor 12 are formed by any semiconductor such as an amorphous semiconductor (amorphous silicon), a microcrystalline semiconductor, a polycrystalline semiconductor (polysilicon), and an organic semiconductor. The microcrystalline semiconductor may be formed by using a silane gas ($SiH_4$) and a fluorine gas ($F_2$), a silane gas and a hydrogen gas, or by delivering laser light to a thin film formed by using these gases.

The gate electrodes of the switching transistor 11 and the driving transistor 12 are formed by a single layer or stacked layers with a conductive material. For example, a staked-layer structure with tungsten (W) and tungsten nitride (WN, the relative proportions between tungsten (W) and nitrogen (N) are not limited), a staked-layer structure with molybdenum (Mo), aluminum (Al), and Mo, or a staked-layer structure with Mo and molybdenum nitride (MoN, the relative proportions between molybdenum (Mo) and nitrogen (N) are not limited) may be employed.

A conductive layer (a source and drain wiring) connected to the impurity regions (the source electrode and the drain electrode) included in the switching transistor 11 and the driving transistor 12 is formed by a single layer or stacked layers with a conductive material. For example, a staked-layer structure with titanium (Ti), aluminum-silicon (Al—Si, which corresponds to aluminum (Al) added with silicon (Si)), and Ti, a staked-layer structure with Mo, Al—Si, and Mo, or a staked-layer structure with MoN, Al—Si, and MoN may be employed. Alternatively, a material containing aluminum as a main component and nickel, or an alloy material containing aluminum as a main component, nickel, and one or both of carbon and silicon may be employed.

The source driver 43 includes a pulse output circuit 44, a latch circuit 45, and a selection circuit 46. The latch circuit 45 includes a first latch circuit 47 and a second latch circuit 48.

The selection circuit 46 operates based on the source control signal (SWE) outputted from the control signal generating circuit 39, and includes an erasing transistor 49 and an analog switch 50. The erasing transistor 49 and the analog switch 50 are provided for each column corresponding to the source line Sx. An inverter 51 generates an inverted signal of the source control signal, which may not be provided in the case where the inverted signal of the source control signal is externally supplied. A gate electrode of the erasing transistor 49 is connected to the control signal generating circuit 39 through a source control signal line 52, one of a source electrode and a drain electrode thereof is connected to the source line Sx, and the other thereof is connected to an erasing power supply 53.

The analog switch 50 is provided between the second latch circuit 48 and the source line Sx. An input node of the analog switch 50 is connected to the second latch circuit 48, and an output node thereof is connected to the source line Sx. One of two control nodes of the analog switch 50 is connected to the source control signal line 52, and the other thereof is connected to the source control signal line 52 through the inverter 51.

The erasing power supply 53 supplies a potential for turning off the driving transistor 12 in the pixel 10. The potential of the erasing power supply 53 is set at L level when the driving transistor 12 is an n-type while it is set at H level when the driving transistor 12 is a p-type.

The pulse output circuit 44 included in the source driver 43 corresponds to a shift register including a plurality of flip-flop circuits. The configuration of the source driver 43 is not limited to the above, and a level shifter, a buffer, a protection circuit, or the like may be provided.

The pulse output circuit 44 is inputted with a clock signal (denoted by SCK in the drawing), an inverted clock signal (denoted by SCKB in the drawing), and a start pulse (denoted by SSP in the drawing), and outputs a sampling pulse to the first latch circuit 47 in accordance with the timing of these signals.

The first latch circuit 47 inputted with data (denoted by DATA in the drawing) holds video signals from the first column to the last column in accordance with the timing at which the sampling pulse is inputted. When a latch pulse (denoted by SLAT in the drawing) is inputted to the second latch circuit 48, the video signals held in the first latch circuit 47 are transmitted to the second latch circuit 48 all at once.

The first gate driver 41 includes a pulse output circuit 54 and a buffer circuit 55. The second gate driver 42 includes a pulse output circuit 56 and a buffer circuit 57. The buffer circuits 55 and 57 each operate based on the first control signal (Signal1) and the second control signal (Signal2) outputted from the control signal generating circuit 39. Each of the buffer circuits 55 and 57 has at least three input nodes and one output node. One of the three input nodes is connected to the pulse output circuit 54 or 56, one is connected to the control signal generating circuit 39 via the first control signal line 37 or 71, and the other is connected to the control signal generating circuit 39 through the second control signal line 38 or 72. The output node is connected to the gate line Gy. As for the buffer circuits 55 and 57, one becomes the active state while the other becomes the high-impedance state based on the first control signal and the second control signal. The number of input nodes in each of the buffer circuits 55 and 57 is at least three, so three or more input nodes may be included.

The pulse output circuit 54 included in the first gate driver 41 and the pulse output circuit 56 included in the second gate driver 42 each correspond to a shift register including a plurality of flip-flop circuits, or a decoder circuit. When adopting a decoder circuit for each of the pulse output circuits 54 and 56, the gate line Gy can be selected at random. When the gate line Gy can be selected at random, pseudo contours that occur when adopting a time gray scale method can be suppressed. The configurations of the first gate driver 41 and the second gate driver 42 are not limited to the above, and a level shifter and a buffer may be provided. Further, each of the first gate driver 41 and the second gate driver 42 may include a protection circuit.

When adopting a shift register for each of the pulse output circuits 54 and 56, the pulse output circuit 54 is inputted with a clock signal (denoted by G1CK in the drawing), an inverted clock signal (denoted by G1CKB in the drawing), and a start pulse (denoted by G1SP in the drawing), and outputs pulses sequentially to the buffer circuit 55 in accordance with the timing of these signals. The pulse output circuit 56 is inputted with a clock signal (denoted by G2CK in the drawing), an inverted clock signal (denoted by G2CKB in the drawing), and a start pulse (denoted by G2SP in the drawing), and outputs pulses sequentially to the buffer circuit 57 in accordance with the timing of these signals.

Figure 2:
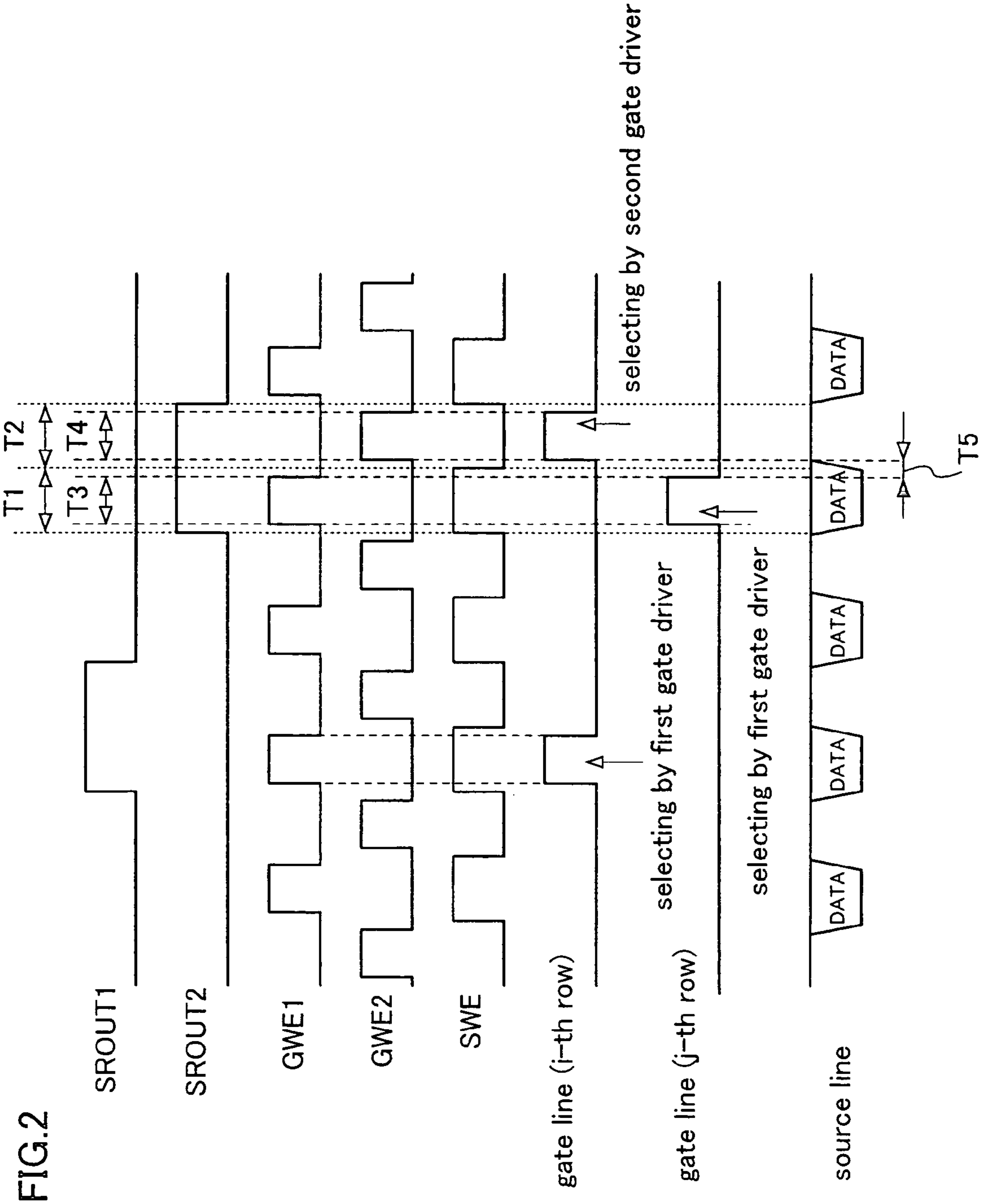
FIG. 2 is a diagram showing a timing chart.

Operation of the display device of the invention having the above-described structure is described below with reference to the timing chart in FIG. 2.

First, description is made on the case where the first control signal is the first gate control signal (GWE1) and the second control signal is the second gate control signal (GWE2). It is provided that periods T1 and T2 each correspond to a half period of the gate selecting period, and the period T1 corresponds to the first sub-gate selecting period while the period T2 corresponds to the second sub-gate selecting period. In addition, a period in which GWE1 is H level and GWE2 is L level is denoted by a period T3, a period in which GWE1 is L level and GWE2 is H level is denoted by a period T4, and a period in which both GWE1 and GWE2 are L level is denoted by a period T5. The operation in the periods T3 to T5 is described.

In the period T3, the first gate control signal is H level and the second gate control signal is L level. One of the buffer circuits 55 and 57 becomes the active state while the other thereof becomes the high-impedance state based on the first gate control signal and the second gate control signal; it is here provided that the buffer circuit 55 becomes the active state while the buffer circuit 57 becomes the high-impedance state. The buffer circuit 55 in the active state transmits a signal of H level to a gate line Gj at the j-th row (j is a positive integer). That is, the buffer circuit 55 selects the gate line Gj. Consequently, the switching transistor 11 connected to the gate line Gj is turned on.

At this time, the source control signal is H level, and the erasing transistor 49 is turned off and the analog switch 50 is turned on. Accordingly, the video signals held in the second latch circuit 48 included in the source driver 43 are transmitted to the plurality of signal lines S1 to Sm all at once for one row. That is, the source driver 43 outputs video signals to pixels each including the transistor connected to the gate line Gj.

Consequently, the video signal is transmitted to the gate electrode of the driving transistor 12, and the driving transistor 12 is turned on or off based on the inputted video signal so that potentials of the two electrodes of the light-emitting element 13 become the same or different from each other. Specifically, when the driving transistor 12 is turned on, the two electrodes of the light-emitting element 13 have different potentials so that a current flows to the light-emitting element 13. On the other hand, when the driving transistor 12 is turned off, the two electrodes of the light-emitting element 13 have the same potential so that no current flows to the light-emitting element 13. Such operation in which the driving transistor 12 is turned on or off based on the video signal and the potentials of the two electrodes of the light-emitting element 13 become the same or different from each other is called a writing operation.

In the period T5, the first gate control signal is L level and the second gate control signal is L level. The gate line Gy is at L level at this time, and neither the writing operation nor the erasing operation is performed.

In the period T4, the first gate control signal is L level and the second gate control signal is H level. It is here provided that the buffer circuit 55 included in the first gate driver 41 becomes the high-impedance state while the buffer circuit 57 included in the second gate driver 42 becomes the active state. The buffer circuit 57 in the active state transmits a signal of H level to a gate line Gi at the i-th row (i is a positive integer). That is, the buffer circuit 57 selects the gate line Gi at the i-th row. Consequently, the switching transistor 11 included in the pixel 10 is turned on.

At this time, the source control signal is L level, and the erasing transistor 49 is turned on and the analog switch 50 is turned off. Accordingly, the plurality of signal lines S1 to Sm are electrically connected to the erasing power supply 53 through the erasing transistors 49 provided for each column. That is, the potential of the plurality of signal lines S1 to Sm becomes the same as that of the erasing power supply 53. That is, the selection circuit 46 included in the source driver 43 outputs a potential of the erasing power supply 53 corresponding to an erasing signal to pixels each including the transistor connected to the gate line Gi.

Consequently, the potential of the erasing power supply 53 corresponding to an erasing signal is transmitted to the gate electrode of the driving transistor 12, and the driving transistor 12 is turned off so that potentials of the two electrodes of the light-emitting element 13 become equal to each other. That is, current does not flow between the electrodes of the light-emitting element 13, thereby the light-emitting element 13 does not emit light. Such operation in which the potential of the erasing power supply 53 is transmitted to the gate electrode of the driving transistor 12, the switching transistor 11 is turned off, and the potentials of the two electrodes of the light-emitting element 13 become equal to each other is called an erasing operation.

In this manner, the gate line Gy is selected by the first gate driver 41 in the period T3 and selected by the second gate driver 42 in the period T4. That is, the gate line Gy is controlled in a complementary manner by the first gate driver 41 and the second gate driver 42. The writing operation is performed in one of the period T3 included in the first sub-gate selecting period T1 and the period T4 included in the second sub-gate selecting period T2, and the erasing operation is performed in the other period thereof.

According to the invention performing the above-described operation, a period for selecting the gate line Gy (the gate line Gi at the i-th row in the above case) by the second gate driver 42 for erasing and a period for outputting a video signal by the source driver 43 do not overlap each other. That is, there is a period (denoted by T5 in the drawing) for outputting a video signal by the source driver 43 while not selecting any of the gate line Gy, which can prevent occurrence of the display defect called a ghost.

Figure 3:
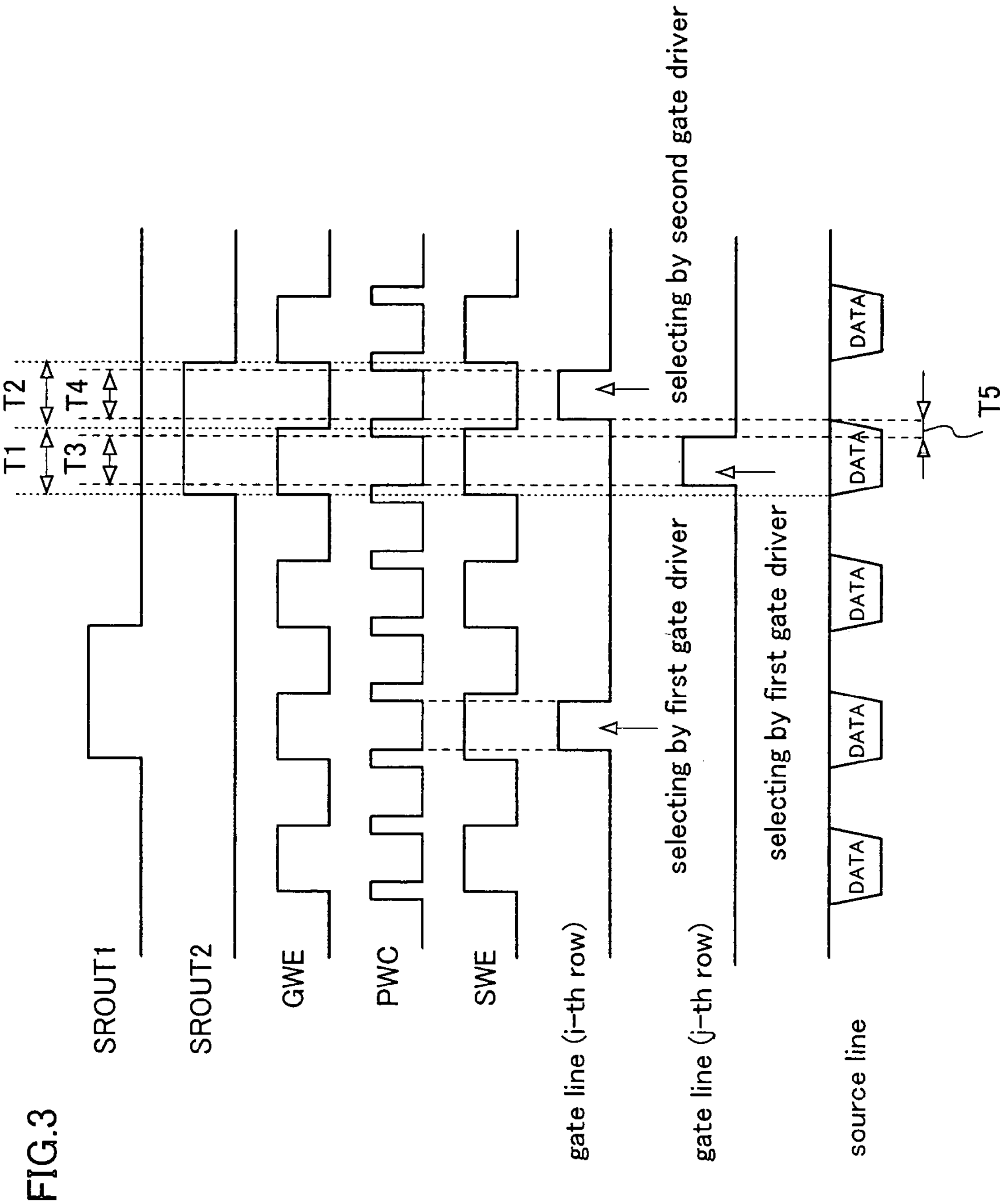
FIG. 3 is a diagram showing a timing chart.

Next, description is made on the case where the first control signal is the gate control signal (GWE) and the second control signal is the pulse-width control signal (PWC) with reference to the timing chart in FIG. 3. It is provided that periods T1 and T2 each correspond to a half period of the gate selecting period, a period in which GWE is H level and PWC is L level is denoted by a period T3, a period in which GWE is L level and PWC is L level is denoted by a period T4, and a period in which GWE is H level or L level and PWC is H level is denoted by a period T5. The operation in the periods T3 to T5 is described.

In the period T3, one of the buffer circuits 55 and 57 becomes the active state while the other thereof becomes the high-impedance state; it is here provided that the buffer circuit 55 becomes the active state while the buffer circuit 57 becomes the high-impedance state. The buffer circuit 55 in the active state transmits a signal of H level to the gate line Gj at the j-th row (is a positive integer). That is, the buffer circuit 55 selects the gate line Gj. The source control signal is H level at this time, and the source driver 43 outputs video signals to pixels each including a transistor connected to the gate line Gj.

In the period T5, the gate control signal is H level or L level and the pulse-width control signal is H level. The gate line Gy is at L level at this time, and neither the writing operation nor the erasing operation is performed.

In the period T4, it is here provided that the buffer circuit 55 included in the first gate driver 41 becomes the high-impedance state while the buffer circuit 57 included in the second gate driver 42 becomes the active state. The buffer circuit 57 in the active state transmits a signal of H level to the gate line Gi at the i-th row (i is a positive integer). That is, the buffer circuit 55 selects the gate line Gi at the i-th row. At this time, the selection circuit 46 included in the source driver 43 outputs a potential of the erasing power supply 53 corresponding to an erasing signal to pixels each including a transistor connected to the gate line Gi.

In this manner, the gate line Gy is selected by the first gate driver 41 in the period T3 and selected by the second gate driver 42 in the period T4. That is, the gate line Gy is controlled in a complementary manner by the first gate driver 41 and the second gate driver 42. The writing operation is performed in one of the period T3 included in the first sub-gate selecting period T1 and the period T4 included in the second sub-gate selecting period T2, and the erasing operation is performed in the other period thereof.

According to the invention performing the above-described operation, a period for selecting the gate line Gy (the gate line Gi at the i-th row in the above case) by the second gate driver 42 for erasing and a period for outputting a video signal by the source driver 43 do not overlap each other. That is, there is a period (denoted by T5 in the drawing) for outputting a video signal by the source driver 43 while not selecting any of the gate line Gy, which can prevent occurrence of the display defect called a ghost.

The gate line at the n-th row (n is a positive integer) is controlled by an output at the n-th row of the first gate driver 41 and an output at the n-th row of the second gate driver 42. One of the first gate driver 41 and the second gate driver 42 is a gate driver for selecting a pixel row where the writing operation is performed, and the other thereof is a gate driver for selecting a pixel row where the erasing operation is performed.

Furthermore, according to the invention performing the above-described operation, since the light-emitting element 13 can be forcibly turned off, the duty ratio can be improved. In addition, a TFT (Thin Film Transistor) for discharging charges of the capacitor 16 is not required although the light-emitting element 13 can be forcibly turned off, thus high opening ratio is realized. If the high opening ratio is realized, the luminance of the light-emitting element can be decreased as the area to emit light increases. That is, since the driving voltage can be decreased, the power consumption can be reduced.

It is to be noted that the invention is not limited to the above-described structure in which one gate selecting period is divided into two, and one gate selecting period may be divided into three or more.

Embodiment Mode 2

A configuration of the display device of the invention is described with reference to the drawing. The display device of the invention includes a monitoring circuit 64 including one or a plurality of monitoring light-emitting elements 66, a constant current source 67, and a buffer amplifier 68 (see FIG. 1). The light-emitting element 13 and the monitoring light-emitting element 66 are formed over the same substrate under the same manufacturing condition by the same process, which have the same or substantially the same characteristics against a change in the ambient temperature and a change with time. The monitoring circuit 64 including one or a plurality of monitoring light-emitting elements 66 may be provided in the pixel region 40 or in a region other than the pixel region 40; however, the monitoring circuit 64 is preferably provided in a region other than the pixel region 40 in order not to adversely affect image display. The constant current source 67 and the buffer amplifier 68 may be provided over the same substrate as the light-emitting element 13 and the monitoring light-emitting element 66, or may be provided over another substrate.

A constant current is supplied from the constant current source 67 to the monitoring light-emitting element 66. When the change of the ambient temperature and the change with time occur in this state, a resistance value of the monitoring light-emitting element 66 itself varies. Accordingly, since a current value of the monitoring light-emitting element 66 is always constant, the potential difference between both the electrodes of the monitoring light-emitting element 66 varies.

In the case of the above configuration, as for the two electrodes of the monitoring light-emitting element 66, the potential of the electrode connected to the counter power supply 18 does not vary whereas the potential of the electrode connected to the constant current source 67 (called here a first electrode) varies. The varied potential of the first electrode of the monitoring light-emitting element 66 is inputted to an input terminal of the buffer amplifier 68. Then, the buffer amplifier 68 outputs a potential from an output terminal thereof, and the potential is supplied to the first electrode of the light-emitting element 13 through the driving transistor 12.

The buffer amplifier 68 is provided to prevent variation of potential in transmitting the potential of the first electrode of the monitoring light-emitting element 66 to the first electrode of the light-emitting element 13. Instead of the buffer amplifier 68, any circuit may be employed as long as it is capable of preventing variation of potential like the buffer amplifier 68. That is, when a potential of one electrode of the monitoring light-emitting element 66 is transmitted to the light-emitting element 13, a circuit for preventing variation of the potential is provided between the monitoring light-emitting element 66 and the light-emitting element 13, which is not limited to the buffer amplifier 68 and a circuit having any configuration can be employed. According to the invention having the above-described configuration, variation in the current value of the light-emitting element due to a change of the ambient temperature or a change with time is suppressed, thereby the reliability can be improved.

In order to prevent too much current from flowing into the monitoring light-emitting element 66, a limiter transistor may be provided to be connected in series to the monitoring light-emitting element 66. In that case, the limiter transistor is set to be always on.

The duty ratio of the light-emitting element 13 and the monitoring light-emitting element 66 becomes different from each other in the case of normal operation. In specific, the duty ratio of the monitoring light-emitting element 66 is 100% whereas the duty ratio of the light-emitting element 13 is approximately 70% even when all the pixels emit white light. Consequently, the total amount of current of the light-emitting element 13 and the total amount of current of the monitoring light-emitting element 66 are different from each other, thus the change with time progresses faster in the monitoring light-emitting element 66 than in the light-emitting element 13. In view of this, a resistor, an external control circuit, or the like may be provided to make the respective total amounts of current of the light-emitting element 13 and the monitoring light-emitting element 66 equal to each other.

Furthermore, the display device of the invention includes a power supply control circuit 63 (see FIG. 1). The power supply control circuit 63 includes a power supply circuit 61 for supplying power to the light-emitting element 13, and a control circuit 62. The power supply circuit 61 is connected to the pixel electrode of the light-emitting element 13 via the driving transistor 12 and the power supply line Vx, and connected to the counter electrode of the light-emitting element 13 via the power supply line Vx.

When a current of the light-emitting element 13 flows from the pixel electrode to the counter electrode, in the case of applying a forward-bias voltage to the light-emitting element 13 to emit light, a potential difference between the power supply line Vx and the counter power supply 18 is set such that the power supply line Vx has a higher potential than the counter power supply 18. On the other hand, in the case of applying a reverse-bias voltage to the light-emitting element 13, the potential difference between the power supply line Vx and the counter power supply 18 is set such that the power supply line Vx has a lower potential than the counter power supply 18. Such a power setting is performed by supplying a predetermined signal from the control circuit 62 to the power supply circuit 61.

According to the invention, a reverse-bias voltage is applied to the light-emitting element 13 by using the power supply control circuit 63, whereby degradation with time of the light-emitting element 13 can be suppressed to improve the reliability. The light-emitting element 13 may have an initial defect that the anode and the cathode thereof are short-circuited due to adhesion of foreign substances, some pinholes that are produced by minute projections of the anode or the cathode, or irregularity of the electroluminescent layer. Such an initial defect may disturb emission/non-emission in accordance with signals, and a favorable image display cannot be performed because all the elements do not emit light with almost all currents flowing to the short-circuit portion, or some specific pixels emit light or not.

However, according to the structure of the invention, a reverse-bias voltage can be applied to the light-emitting element, whereby a current can locally flow only to the short-circuit portion between the anode and the cathode so as to generate heat at the short-circuit portion. As a result, the short-circuit portion can be insulated (to be high resistant) by oxidizing or carbonizing. Consequently, even when an initial defect occurs, favorable image display can be performed by eliminating the defect.

Note that insulation (to be high resistant) of such an initial defect is preferably carried out before shipment of a device. Further, not only an initial defect, but another defect might occur with time where the anode and the cathode are short-circuited. Such a defect is also called a progressive defect. However, according to the invention where a reverse-bias voltage can be applied to the light-emitting element at regular intervals, such a progressive defect can also be eliminated and favorable image display can be performed. Note that the timing for applying a reverse-bias voltage to the light-emitting element 13 is not specifically limited.

Embodiment Mode 3

A configuration of the gate driver of the invention is described with reference to the drawing. The second gate driver 42 has a similar configuration-to the first gate driver 41, and description herein is made on the first gate driver 41.

Figure 4:
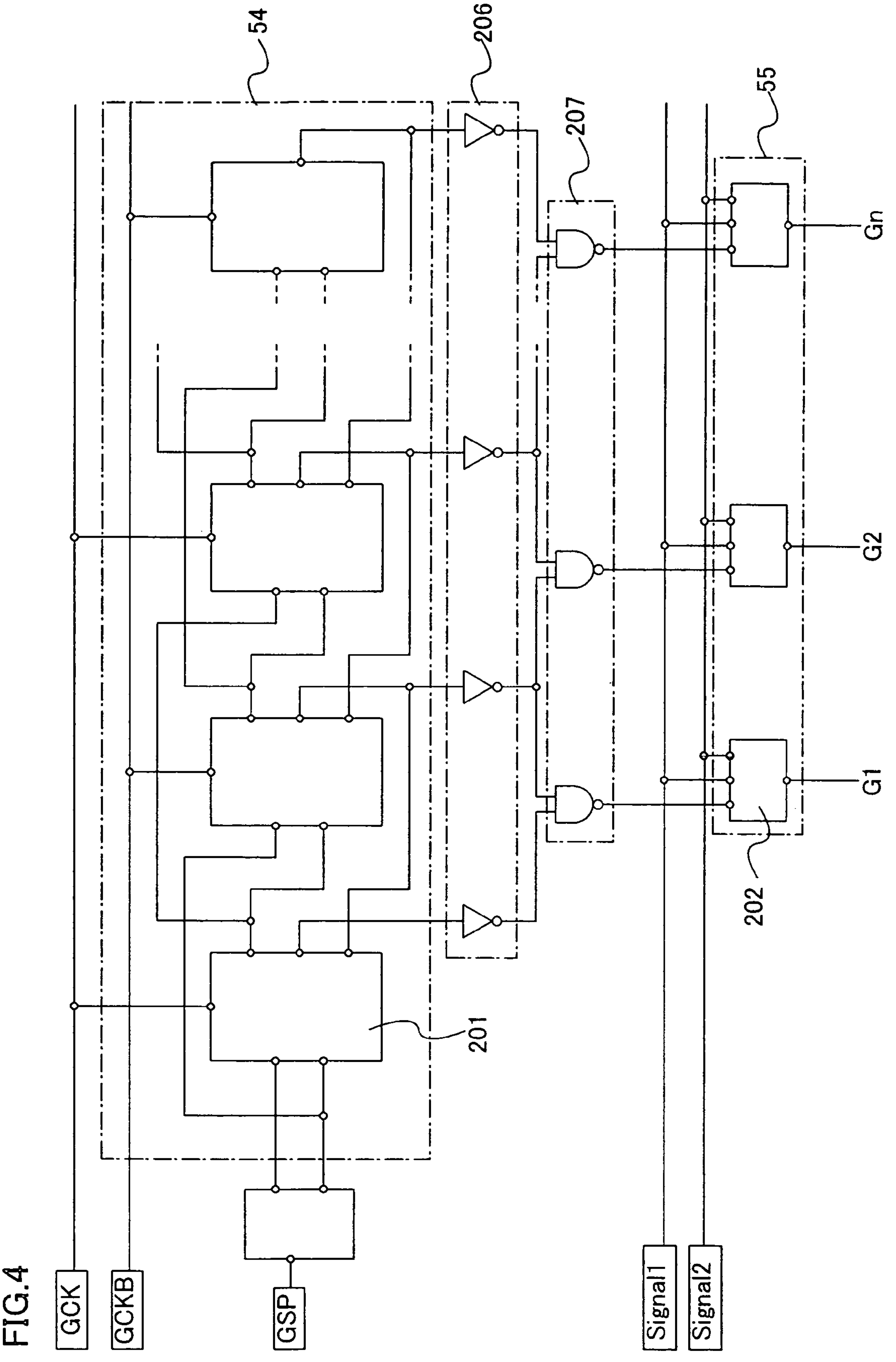
FIG. 4 is a diagram showing constitution of the gate driver.

The first gate driver 41 includes the pulse output circuit 54 and the buffer circuit 55 (see FIG. 4). In addition, an inverter 206 and a NAND 207 are provided between the pulse output circuit 54 and the buffer circuit 55. The pulse output circuit 54 includes a plurality of unit circuits 201, and the buffer circuit 55 also includes a plurality of unit circuits 202. The pulse output circuit 54 outputs a sampling pulse to the lower stage based on GCK, GCKB, and GSP. The buffer circuit 55 selects the gate line Gy based on the output of the pulse output circuit 54, the first control signal (Signal1), and the second control signal (Signal2).

Figures 5A, 5B:
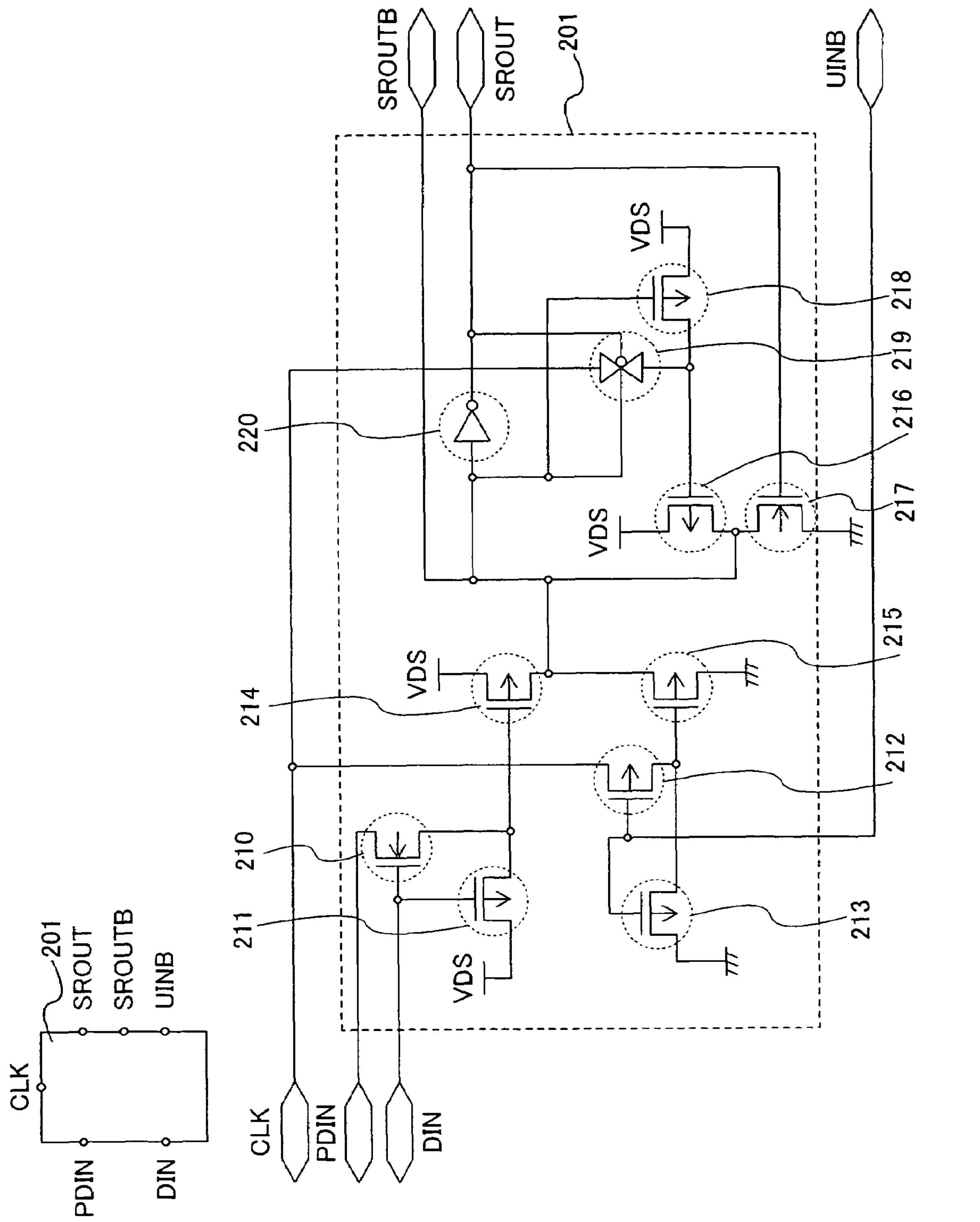
FIGS. 5A and 5B are diagrams each showing a configuration of the gate driver.

The unit circuit 201 forming the pulse output circuit 54 includes transistors 210 to 218, an analog switch 219, and an inverter 220 (see FIG. 5).

Figure 6A:
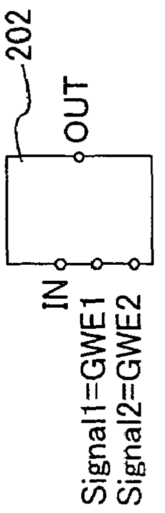
FIGS. 6A and 6B are diagrams each showing a configuration of the gate driver.
Figure 6B:
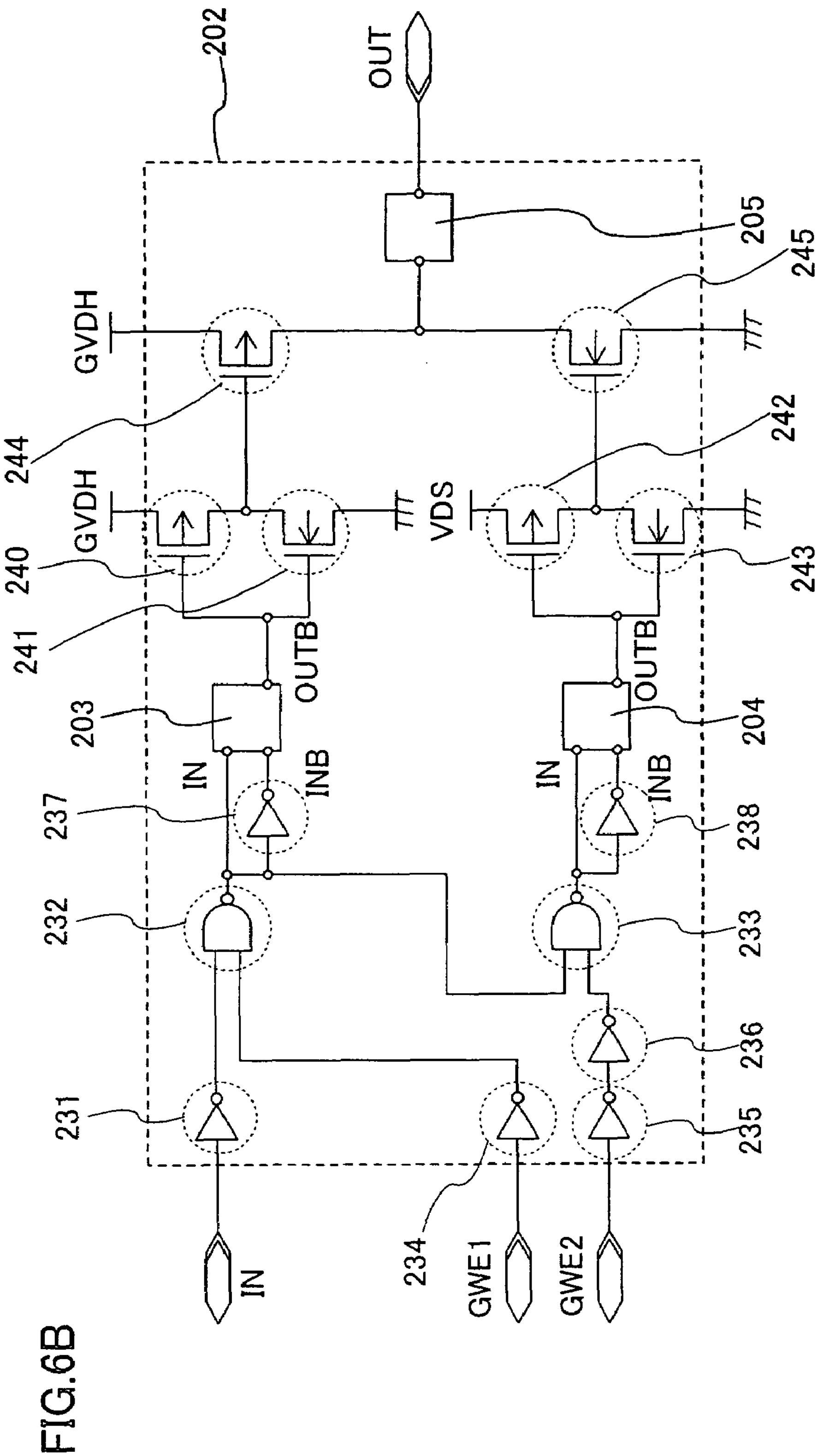

In the case where the first control signal (Signal1) is the first gate control signal while the second control signal (Signal2) is the second gate control signal, the unit circuit 202 forming the buffer circuit 55 includes NANDs 232 and 233, inverters 231, and 234 to 238, transistors 240 to 245, level shifters 203 and 204, and a protection circuit 205 (see FIG. 6).

Figure 7A:
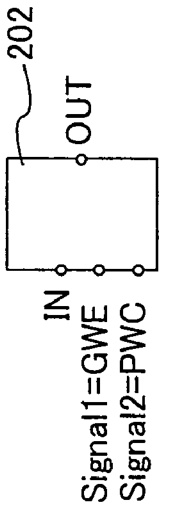
FIGS. 7A and 7B are diagrams each showing a configuration of the gate driver.
Figure 7B:
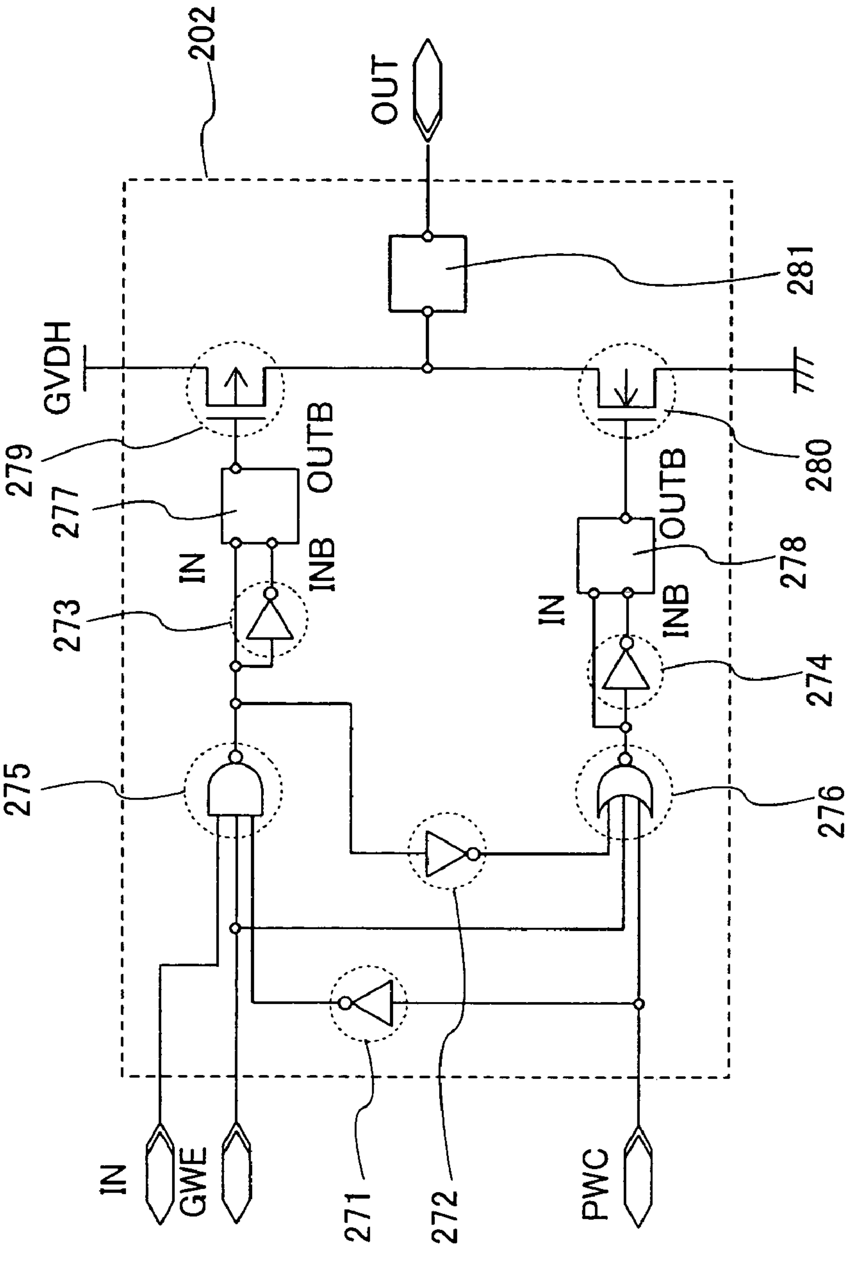

On the other hand, in the case where the first control signal (Signal1) is the gate control signal while the second control signal (Signal2) is the pulse-width control signal, the unit circuit 202 forming the buffer circuit 55 includes inverters 271 to 274, a NAND 275, a NOR 276, transistors 279 and 280, level shifters 277 and 278, and a protection circuit 281 (see FIG. 7).

The level shifters 203, 204, 277 and 278 are circuits for stepping up a voltage. The protection circuits 205 and 281 are provided to suppress degradation or destruction of an element due to static electricity. The protection circuits 205 and 281 are each configured by one or plural kinds of elements selected from a transistor, a resistor, a capacitor, and a rectifying element. The rectifying element means an element having the rectification property, which corresponds to a transistor whose gate electrode and drain electrode are connected to each other, or a diode.

Embodiment Mode 4

Figure 8:
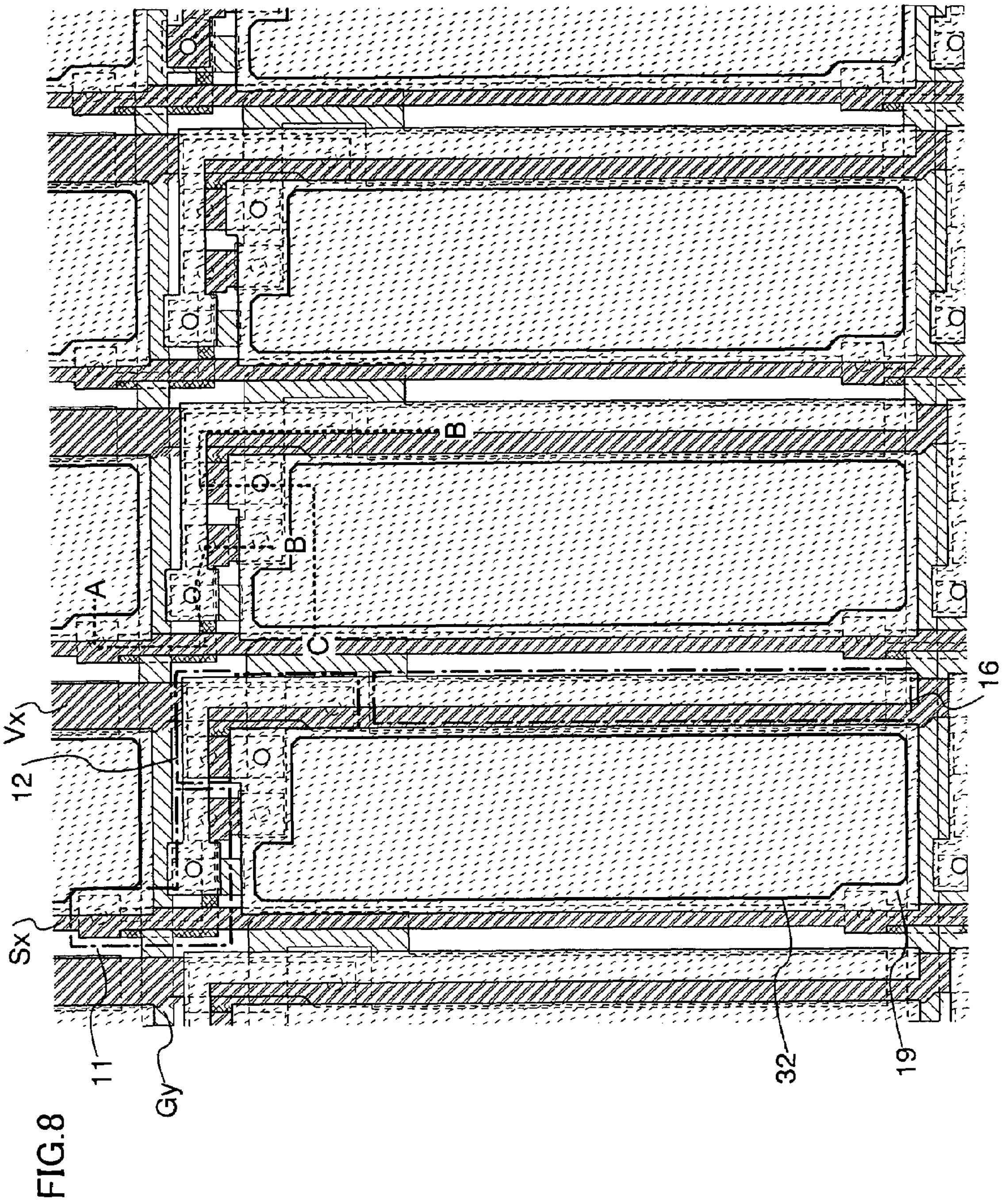
FIG. 8 is a diagram showing a structure of the display device.

A layout of the pixel 10 forming the display device of the invention is described with reference to FIG. 8. In this layout, the switching transistor 11, the driving transistor 12, the capacitor 16, and a conductive layer 19 corresponding to the pixel electrode of the light-emitting element 13 are shown.

Figure 9:
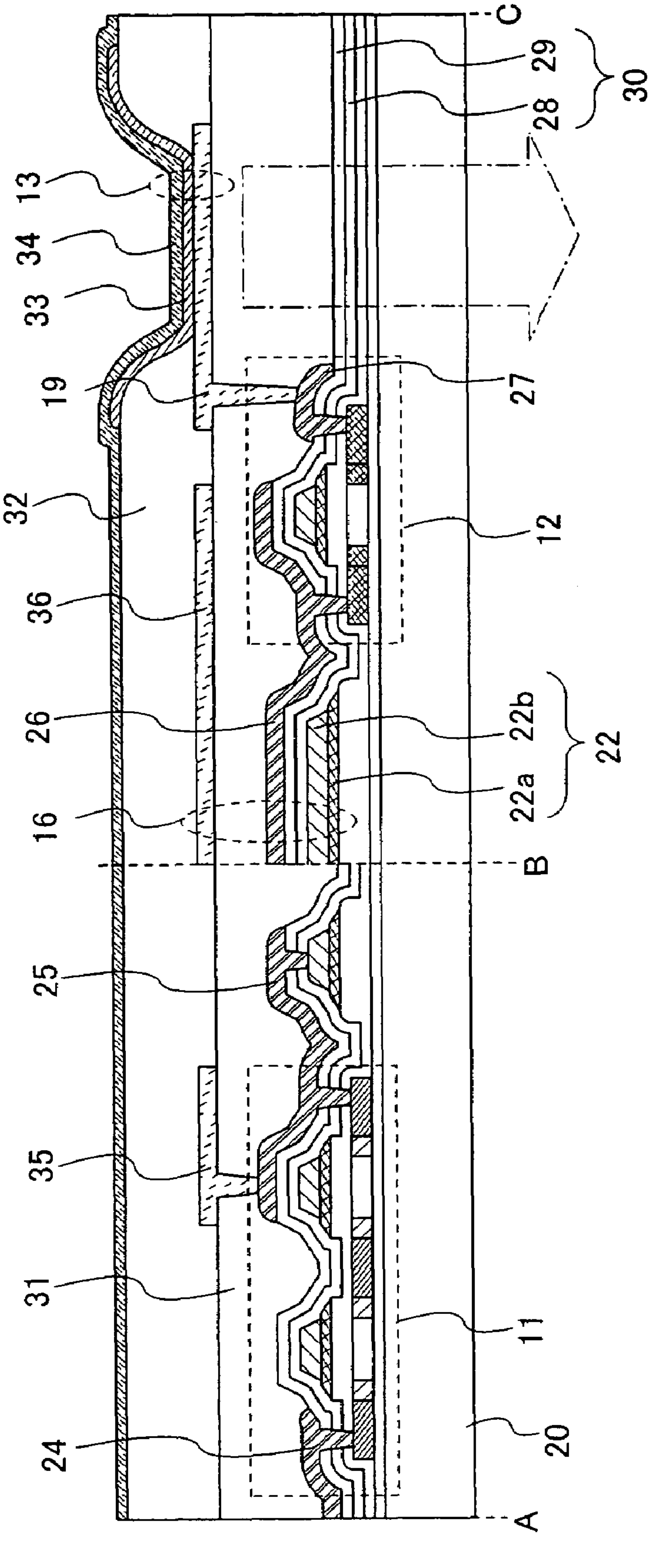
FIG. 9 is a view showing a structure of the display device.

A sectional structure taken along a line A-B-C of this layout is described with reference to FIG. 9 below. The switching transistor 11, the driving transistor 12, the light-emitting element 13, and the capacitor 16 are provided over a substrate 20 having an insulating surface such as a glass or quartz substrate.

The light-emitting element 13 corresponds to a stacked-layer of the conductive layer 19 corresponding to the pixel electrode, an electroluminescent layer 33, and a conductive layer 34 corresponding to the counter electrode. In the case where both of the conductive layers 19 and 34 transmit light, the light-emitting element 13 emits light in the direction of the conductive layer 19 and the direction of the conductive layer 34. That is, the light-emitting element 13 performs dual emission. In the case where one of the conductive layers 19 and 34 transmits light while the other shields light, the light-emitting element 13 emits light only in the direction of the conductive layer 19 or only in the direction of the conductive layer 34. That is, the light-emitting element 13 performs top emission or bottom emission. In FIG. 9, a sectional structure in which the light-emitting element 13 performs bottom emission is shown.

The capacitor 16 is provided between the gate electrode and the source electrode of the driving transistor 12 and holds a gate-source voltage of the driving transistor 12. The capacitor 16 is formed by conductive layers 22*a* and 22*b* (hereinafter collectively referred to as a conductive layer 22) provided in the same layer as the gate electrodes of the switching transistor 11 and the driving transistor 12, a conductive layer 26 corresponding to a source and drain wiring of the driving transistor 12, and an insulating layer between the conductive layer 22 and the conductive layer 26.

The capacitor 16 is also formed by the conductive layer 26 corresponding to the source and drain wiring of the driving transistor 12, a conductive layer 36 provided in the same layer as the pixel electrode of the light-emitting element 13, and an insulating layer between the conductive layers 26 and 36. As shown in FIG. 9, a conductive layer 35 is connected to the conductive layer 36.

According to the above structure, the capacitor 16 can have sufficient capacitance to hold the gate-source voltage of the driving transistor 12. Moreover, the capacitor 16 is provided under the conductive layer which forms the power supply line. Accordingly, decrease of the aperture ratio due to arrangement of the capacitor 16 does not occur. In addition, as a gate insulating film of the switching transistor 11 and the driving transistor 12 is not used for the capacitor 16, a gate leak current can be reduced, which leads to reduction in the power consumption.

Conductive layers 24 to 27 corresponding to the source and drain wiring of the switching transistor 11 and the driving transistor 12 each has a thickness of 500 to 2000 nm, and preferably 500 to 1300 nm. The conductive layers 24 to 27 form the source line Sx and the power supply line Vx, and therefore, an adverse effect of voltage drop can be suppressed by forming the conductive layers 24 to 27 thick as described above. It is to be noted that, while wiring resistance can be decreased by forming the conductive layers 24 to 27 thick, too thick conductive layers make an accurate patterning difficult and projections and depressions over the surfaces thereof become obstacles. Therefore, the thickness of the conductive layers 24 to 27 is preferably determined in the aforementioned range in consideration of the wiring resistance, the difficulty in patterning, and an effect of projections and depressions over the surfaces.

The display device of the invention further includes insulating layers 28 and 29 (hereinafter collectively referred to as a first insulating layer 30) which cover the switching transistor 11 and the driving transistor 12, a second insulating layer 31 provided over the first insulating layer 30, and the conductive layer 19 corresponding to the pixel electrode over the second insulating layer 31. If the second insulating layer 31 is not formed, the conductive layer 19 is provided in the same layer as the conductive layers 24 to 27 corresponding to the source and drain wiring. Then, a region where the conductive layer 19 is provided is restricted to be a region other than a region where the conductive layers 24 to 27 are provided. By providing the second insulating layer 31, however, the region where the conductive layer 19 can be provided expands, thus high aperture ratio can be realized. This structure is efficient in the case of the top emission, in particular. With the high aperture ratio, the driving voltage is decreased as the area to emit light increases, which can reduce the power consumption.

It is to be noted that the first insulating layer 30 and the second insulating layer 31 are formed of an inorganic material such as silicon oxide or silicon nitride, an organic material such as polyimide or acrylic, and the like. The first insulating layer 30 and the second insulating layer 31 may be formed of the same material or different materials. For the organic material, a siloxane-based material is preferably used. The siloxane-based material is composed of a skeleton formed by the bond of silicon and oxygen, in which an organic group containing at least hydrogen (e.g., an alkyl group or aromatic hydrocarbon) is included as a substituent. Alternatively, a fluoro group may be used as the substituent. Further alternatively, a fluoro group and an organic group containing at least hydrogen may be used as the substituent.

A partition wall layer (also called an insulating layer or a bank) 32 may be formed of an inorganic material or an organic material. In is to be noted that, as the electroluminescent layer of the light-emitting element 13 is provided so as to be in contact with the partition wall layer 32, it is preferable that the partition wall layer 32 have a shape of which curvature radius continuously changes so that a pinhole and the like do not occur in the electroluminescent layer. Further, the partition wall layer 32 is preferably formed of a material which shields light so as to make boundaries between pixels clear.

Embodiment Mode 5

An example of a pixel circuit which can be applied to the display device of the invention is described below.

Figure 10:
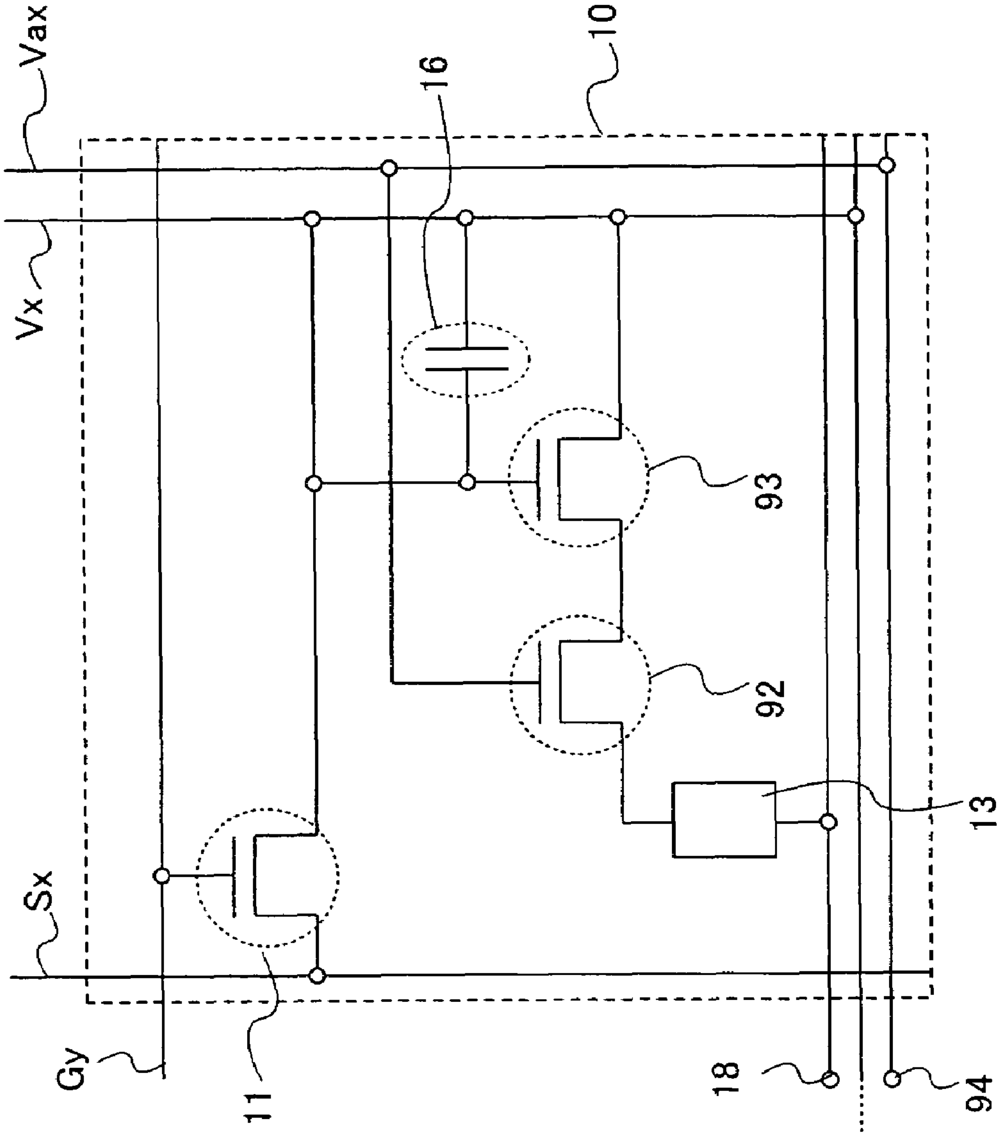
FIG. 10 is a diagram showing a configuration of the display device.

FIG. 10 shows a pixel circuit in which transistors 92 and 93 and a power supply line Vax (x is a positive integer, satisfying $1 \leqq x \leqq m$) are provided additionally to the pixel 10 shown in FIG. 1 while eliminating the driving transistor 12. The power supply line Vax is connected to a power supply 94. According to this structure, by connecting a gate electrode of the transistor 92 to the power supply line Vax holding a fixed potential, the potential of the gate electrode of the transistor 92 is fixed and the transistor 92 operates in the saturation region. Meanwhile, the transistor 93 operates in the linear region, and the gate electrode thereof is inputted with a video signal including data on whether the pixel 10 emits light or not. As a source-drain voltage of the transistor 93 which operates in the linear region is low, slight variations in the gate-source voltage of the transistor 93 do not affect the current value flowing to the light-emitting element 13. Therefore, the current value flowing to the light-emitting element 13 is determined by the transistor 92 which operates in the saturation region. According to the invention having the above structure, image quality can be enhanced by improving luminance variations of the light-emitting element 13 due to variations in characteristics of the transistor 92.

As a pixel circuit other than the above-described one, a pixel circuit employing a current mirror circuit may be used as well, though not shown.

Either an analog video signal or a digital video signal may be used for the display device of the invention. There are a digital video signal using a voltage and a digital video signal using a current in the case of using a digital video signal. That is, a video signal inputted to the pixel when the light-emitting element emits light is a voltage or a current. When the video signal is a voltage, a voltage applied to the light-emitting element is constant or a current supplied to the light-emitting element is constant. When the video signal is a current, a voltage applied to the light-emitting element is constant or a current supplied to the light-emitting element is constant. When a constant voltage is applied to the light-emitting element, a so-called constant voltage drive is performed whereas when a constant current is supplied to the light-emitting element, a so-called constant current drive is performed. According to the constant current drive, a constant current flows to the light-emitting element regardless of resistance variations of the light-emitting element. A video signal of voltage is used for the display device of the invention, though either the constant current drive or the constant voltage drive may be employed.

The electroluminescent layer is formed of a material which exhibits light emission from the singlet excited state (hereinafter referred to as a singlet-excited light emitting material) or a material which exhibits light emission from the triplet excited state (hereinafter referred to as a triplet-excited light emitting material). For example, among a red-light-emitting element, a green-light-emitting element and a blue-light-emitting element, the red-light-emitting element which has relatively short half-brightness time is formed of a triplet-excited light emitting material, and the others are formed of a singlet-excited light emitting material. The triplet-excited light emitting material which has high light emission efficiency has an advantage in that the same luminance can be obtained by lower power consumption.

Alternatively, the red-light and green-light-emitting elements may be formed of a triplet-excited light emitting material, and the blue-light-emitting element may be formed of a singlet-excited light emitting material. By forming the green-light-emitting element in which human visibility is high by the triplet-exited light emitting material, power consumption can be further reduced. As the triplet-exited light emitting material, there is a material using a metal complex as dopant such as a metal complex containing platinum that is a third transition element as a central metal and a metal complex containing iridium as a central metal. In addition, for the electroluminescent layer, any of a low molecular weight material, a medium molecular weight material, and a high molecular weight material can be employed.

The light-emitting element may have a forward stacking structure in which an anode, an electroluminescent layer, and a cathode are stacked in this order from the bottom, or a reverse stacking structure in which a cathode, an electroluminescent layer, and an anode are stacked in this order from the bottom. For the anode or the cathode of the light-emitting element, indium tin oxide (ITO) which transmits light, a material obtained by adding silicon oxide to ITO, indium zinc oxide (IZO), zinc oxide doped with gallium (Ga) (GZO) or the like may be used.

Alternatively, the light-emitting element may have a stacking structure in which an electroluminescent layer and a charge generating layer are stacked between an anode and a cathode such as a structure in which the anode, the electroluminescent layer, the charge generating layer, . . . , the electroluminescent layer, the charge generating layer, . . . , the electroluminescent layer, and the cathode are stacked in this order. Such an element is called a tandem element. The charge generating layer is formed of a metal, an inorganic semiconductor such as molybdenum oxide, an organic compound doped with lithium, or the like.

In the case of performing a color display by using a panel including a light-emitting element, an electroluminescent layer having a different wavelength is preferably provided in each pixel. Typically, it is preferable to provide electroluminescent layers corresponding to each color of red (R), green (G), and blue (B). In that case, it is preferable to provide the monitoring light-emitting elements 66 corresponding to each of red, green, and blue, to correct the power supply potential for each color. In that case, on a light emission side of the light-emitting element, a filter which transmits light of its wavelength (a colored layer) is preferably provided, so that the color purity can be improved and a mirror surface of the pixel portion (glare) can be prevented. By providing the filter, a circular polarizer and the like which are conventionally required can be omitted, so that light can be emitted from the electroluminescent layer without loss. Moreover, a change in tone which occurs when the pixel region is seen obliquely can be reduced.

The electroluminescent layer can have a structure which emits monocolor light or white light. In the case of using a white-light emitting material, a color display can be performed by providing the filter which transmits light of a specific wavelength on a light emission side of the light-emitting element.

Embodiment Mode 6

Hereinafter described is a panel mounting the pixel region 40, the first gate driver 41, the second gate driver 42, and the source driver 43, which is one mode of the display device of the invention. The pixel region 40 including a plurality of pixels each having the light-emitting element 13, the first gate driver 41, the second gate driver 42, the source driver 43 and a connecting film 407 are provided over the substrate 20 (see FIG. 11A). The connecting film 407 is connected to an external circuit (an IC chip).

Figure 11A:
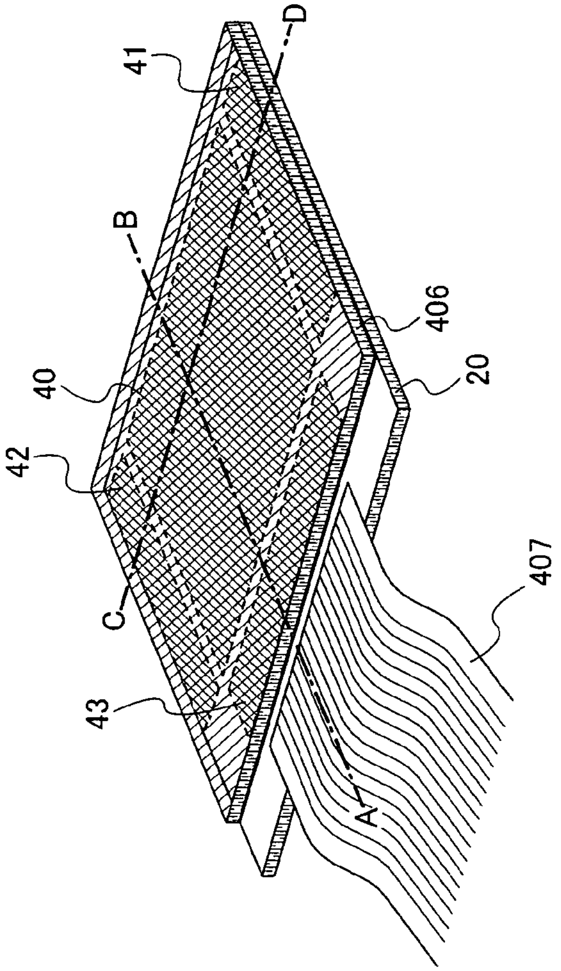
FIGS. 11A and 11B are views showing a structure of the display device.
Figure 11B:
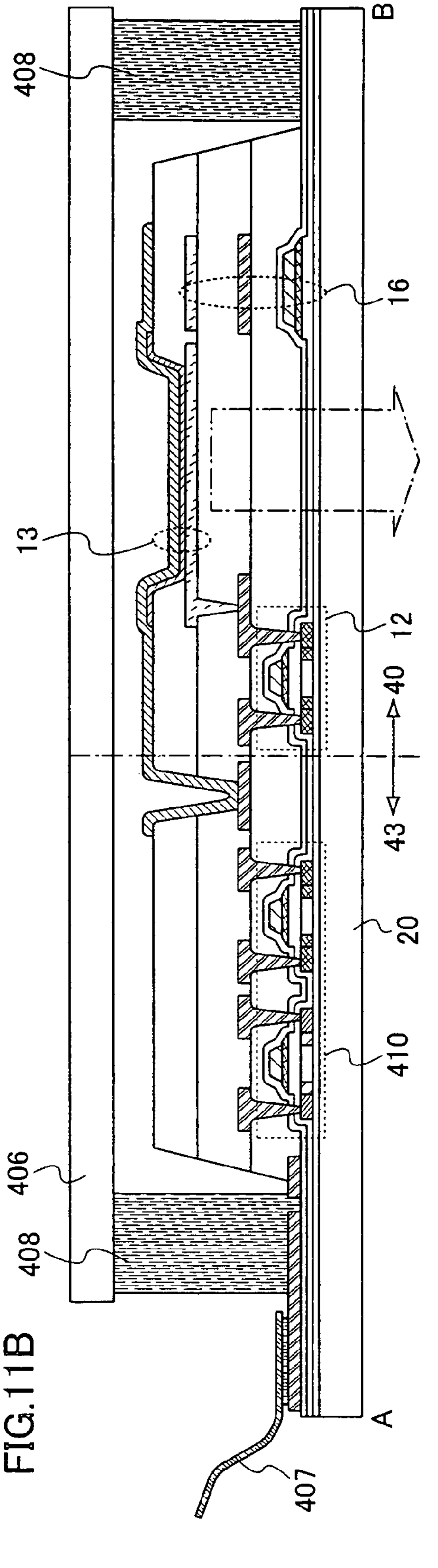

FIG. 11B is a sectional view taken along a line A-B of the panel, including the driving transistor 12, the light-emitting element 13, and the capacitor 16 which are provided in the pixel region 40, and a CMOS circuit 410 provided in the source driver 43.

A sealing material 408 is provided around the pixel region 40, the first gate driver 41, the second gate driver 42, and the source driver 43. The light-emitting element 13 is sealed with the sealing material 408 and a counter substrate 406. This sealing process is performed for protecting the light-emitting element 13 from moisture. Here, a covering material (glass, ceramics, plastic, metal and the like) is used for sealing, however, a heat curable resin or an ultraviolet curable resin may be used, or a thin film having high barrier property such as metal oxide and nitride may be used as well. An element formed over the substrate 20 is preferably formed of a crystalline semiconductor (polysilicon) which has favorable mobility and the like as compared to an amorphous semiconductor, thus a monolithic structure over the same surface can be realized. A panel having the above structure requires less number of external ICs to be connected, and therefore, compactness, lightweight, and thin design are achieved.

Figure 12:
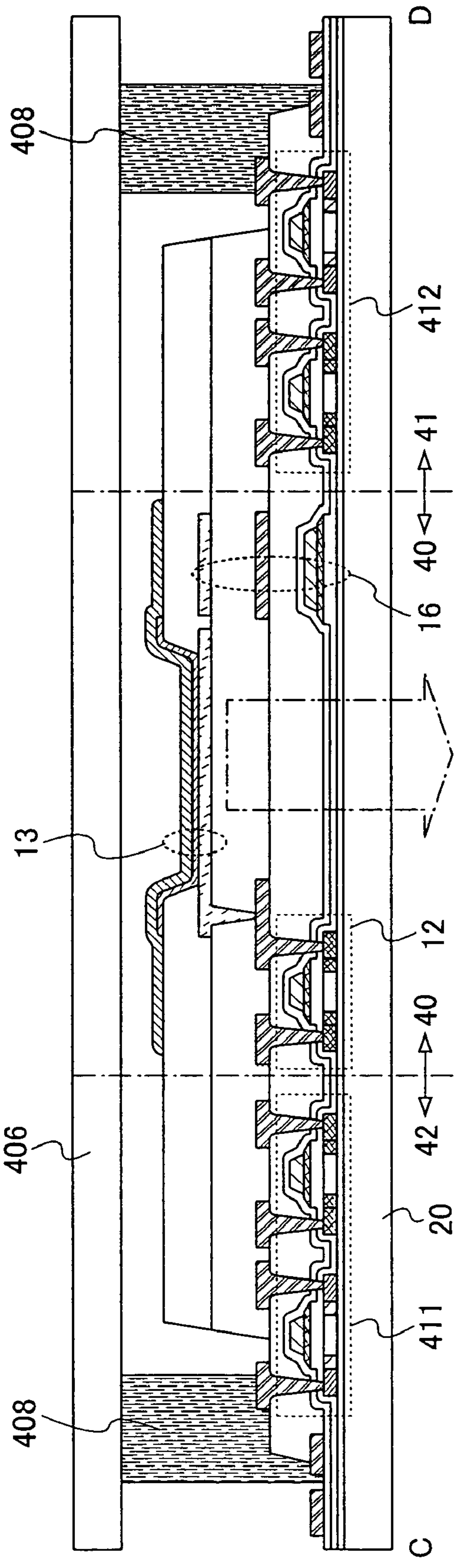
FIG. 12 is a view showing a structure of the display device.

FIG. 12 is a sectional view taken along a line C-D of the panel, including the driving transistor 12, the light-emitting element 13, and the capacitor 16 which are provided in the pixel region 40, a CMOS circuit 412 provided in the first gate driver 41, and a CMOS circuit 411 provided in the second gate driver 42. The panel in FIG. 12 is provided with the sealing material 408 so as to overlap the first gate driver 41 and the second gate driver 42. With the above structure, the frame size can be reduced.

In the structures shown in FIGS. 11A and 11B and FIG. 12, the pixel electrode of the light-emitting element 13 transmits light while the counter electrode thereof shields light. Therefore, the light-emitting element 13 performs the bottom emission.

Figure 13A:
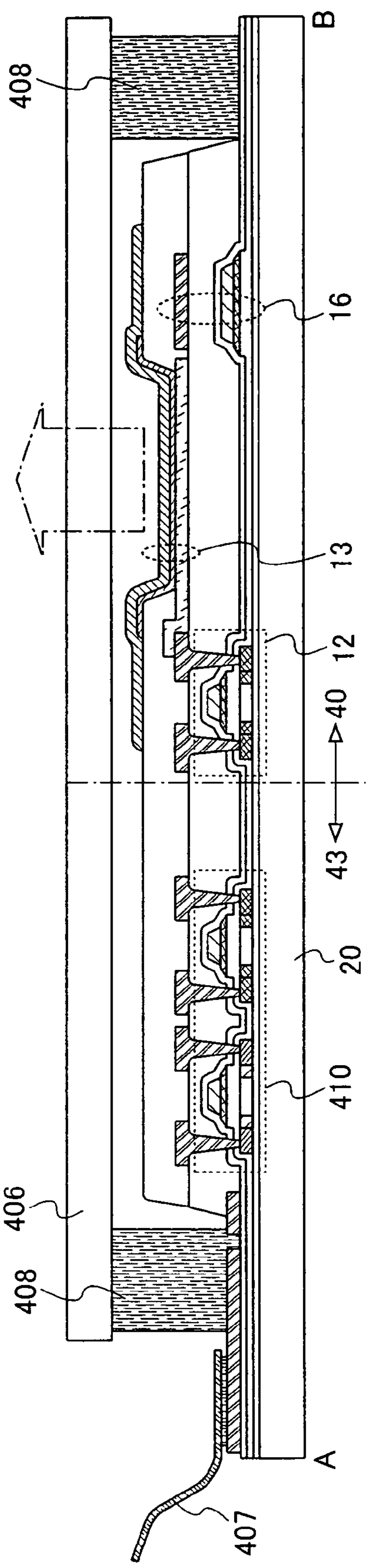
FIGS. 13A and 13B are views each showing a structure of the gate driver.

Alternatively, there is a case where the pixel electrode of the light-emitting element 13 shields light while the counter electrode thereof transmits light (see FIG. 13A). In that case, the light-emitting element 13 performs the top emission.

Figure 13B:
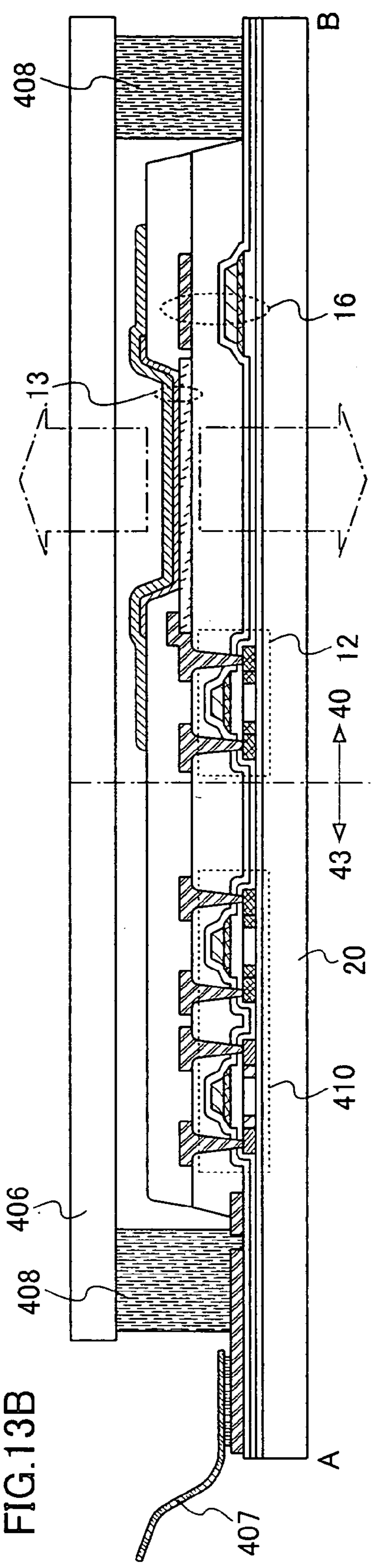

Furthermore, there is a case where the pixel electrode and the counter electrode of the light-emitting element 13 transmit light (see FIG. 13B). In that case, the light-emitting element 13 performs the dual emission.

In the case of the bottom emission and the dual emission, it is preferable that a conductive layer (a source and drain wiring) connected to an impurity region included in the driving transistor 12 be formed by combining aluminum (Al) and a material having low reflectivity such as molybdenum (Mo). In specific, a stacked-layer structure of Mo, Al—Si, and Mo, a stacked-layer structure of MoN, Al—Si, and MoN, and the like are preferably employed. Accordingly, it can be prevented that light emitted from the light-emitting element reflects on the source and drain wiring, thereby the light can be emitted to the outside. The display device of the invention may employ any one of the bottom, top, and dual emission structures.

In the structures shown in FIGS. 11A and 11B and FIG. 12, an insulating layer is provided on the source and drain wiring of the driving transistor 12, on which the pixel electrode of the light-emitting element 13 is formed. However, the invention is not limited to this structure, and the pixel electrode of the light-emitting element 13 may be formed in the same layer as that of the source and drain wiring of the driving transistor 12 as the structures shown in FIGS. 13A and 13B. In addition, at an overlap portion between the source and drain wiring of the driving transistor 12 and the pixel electrode of the light-emitting element 13, the source and drain wiring of the driving transistor 12 and the pixel electrode of the light-emitting element 13 are stacked in this order from the bottom as shown in FIG. 13A, or a structure where the pixel electrode of the light-emitting element 13 and the source and drain wiring of the driving transistor 12 are stacked in this order from the bottom as shown in FIG. 13B.

It is to be noted that the pixel region 40 may be formed of TFTs (Thin Film Transistors) formed over an insulating surface, each having a channel region formed of an amorphous semiconductor (amorphous silicon), and the first gate driver 41, the second gate driver 42, and the source driver 43 may be formed of an IC chip. The IC chip may be attached to the substrate 20 by a COG method or to the connecting film 407 which is connected to the substrate 20. The amorphous semiconductor can be easily formed over a large substrate by a CVD method and does not require a crystallization step, which can provide an inexpensive panel. At that time, by forming the conductive layer by a droplet discharge method represented by an ink-jetting method, a more inexpensive panel can be provided.

Embodiment Mode 7

An electronic apparatus having a pixel region including a light-emitting element includes a television set (also simply called a television or a television receiver), a digital camera, a digital video camera, a mobile phone unit (also simply called a mobile phone set or a mobile phone), a portable data terminal such as a PDA, a portable game machine, a monitor for a computer, a computer, a sound reproducing device such as a car audio set, an image reproducing device provided with a recording medium such as a home game machine, and the like. Specific examples thereof are described with reference to FIGS. 14A to 14F.

Figures 14A, 14B, 14C, 14D, 14E, 14F:
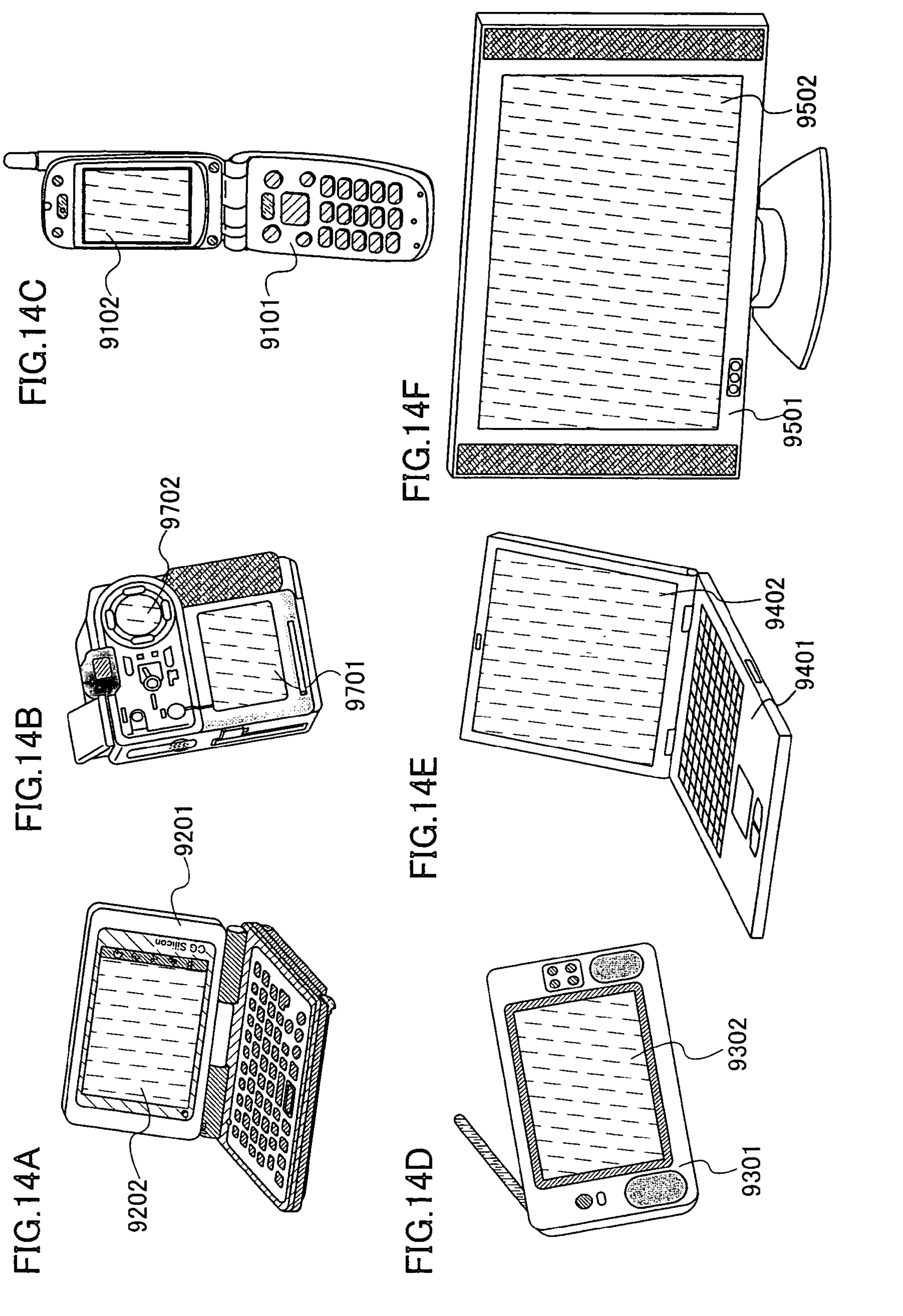
FIGS. 14A to 14F are views each showing a structure of the electronic apparatus.
Figure 15:
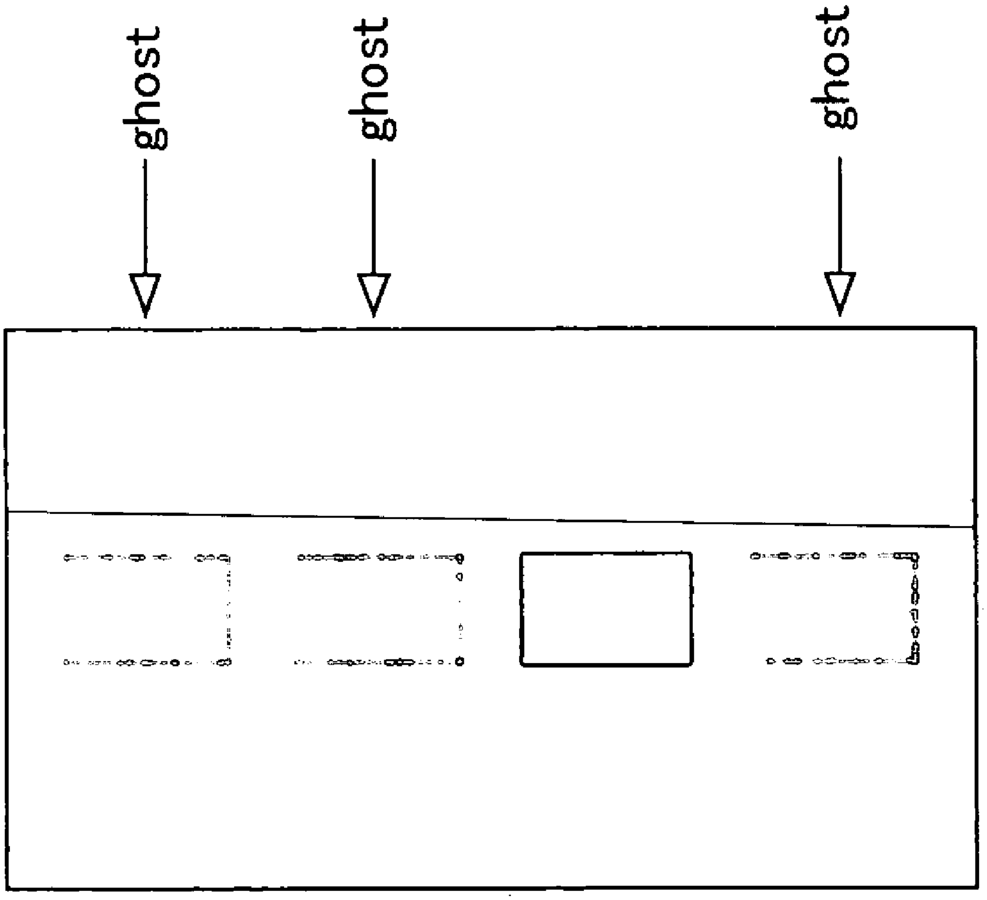
FIG. 15 is a view showing the display defect which is called a ghost.
Figure 16:
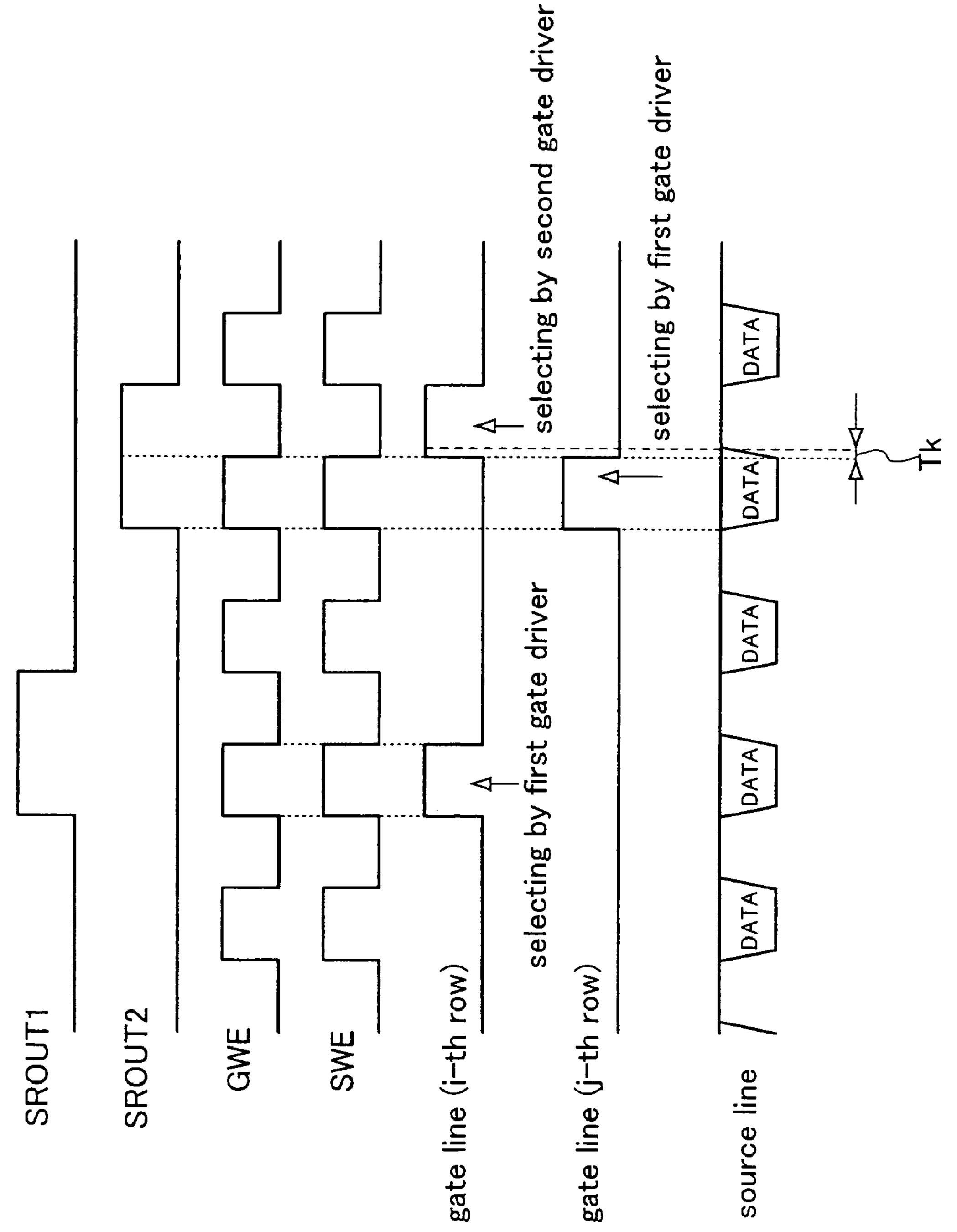
FIG. 16 is a diagram showing a timing chart.

A portable data terminal includes a main body 9201, a display portion 9202, and the like (see FIG. 14A). Embodiment Modes 1 to 6 can be applied to the display portion 9202.

A digital video camera includes a display portions 9701 and 9702, and the like (see FIG. 14B). Embodiment Modes 1 to 6 can be applied to the display portions 9701 and 9702.

A portable terminal includes a main body 9101, a display portion 9102, and the like (see FIG. 14C). Embodiment Modes 1 to 6 can be applied to the display portion 9102.

A portable television set includes a main body 9301, a display portion 9302, and the like (see FIG. 14D). Embodiment Modes 1 to 6 can be applied to the display portion 9302. Such a television set can be widely applied to a small-sized one to be incorporated in a portable terminal such as a mobile phone, a portable middle-sized one, and a large-sized one (e.g., 40 inches or larger).

A portable computer includes a main body 9401, a display portion 9402, and the like (see FIG. 14E). Embodiment Modes 1 to 6 can be applied to the display portion 9402.

A television set includes a main body 9501, a display portion 9502, and the like (see FIG. 14F). Embodiment Modes 1 to 6 can be applied to the display portion 9502.

In any one of the above-described electronic apparatuses, when a secondary battery is employed, the operating time can be prolonged by a reduction of power consumption and the step of charging the secondary battery may be omitted.

This application is based on Japanese Patent Application serial no. 2004-192157 filed in Japan Patent Office on 29, Jun., 2004, the entire contents of which are hereby incorporated by reference.

What is claimed is:

1. A display device comprising:

a pixel region including a plurality of pixels, a source driver, a first gate driver, a second gate driver, a plurality of gate signal lines, a plurality of source signal lines, and a control signal generating circuit, wherein each of the plurality of pixels includes a light-emitting element, a first transistor for controlling video signal input to the pixel, a second transistor for controlling whether the light-emitting element emits light or not, and a capacitor for holding the video signal, wherein each of the plurality of gate signal lines is electrically connected to the first gate driver and the second gate driver, and each of the plurality of source signal lines is electrically connected to the source driver, wherein the source driver includes a pulse output circuit, a latch circuit, and a selection circuit which operates based on a source control signal outputted from the control signal generating circuit, wherein each of the first gate driver and the second gate driver includes a pulse output circuit, and a buffer circuit which operates based on a first gate control signal and a second gate control signal both outputted from the control signal generating circuit, and wherein a potential of one of the plurality of source signal lines is changed while none of the plurality of the gate signal lines is selected.

2. An electronic apparatus comprising the display device according to claim 1.

3. A display device comprising:

a pixel region including a plurality of pixels, a source driver, a first gate driver, a second gate driver, a plurality of gate signal lines, a plurality of source signal lines, and a control signal generating circuit, wherein each of the plurality of pixels includes a light-emitting element, a first transistor for controlling video signal input to the pixel, a second transistor for controlling whether the light-emitting element emits light or not, and a capacitor for holding the video signal, wherein each of the plurality of gate signal lines is electrically connected to the first gate driver and the second gate driver, and each of the plurality of source signal lines is electrically connected to the source driver, wherein the source driver includes a pulse output circuit, a latch circuit, and a selection circuit which operates based on a source control signal outputted from the control signal generating circuit, and wherein each of the first gate driver and the second gate driver includes a pulse output circuit, and a buffer circuit which operates based on a first gate control signal and a second gate control signal both outputted from the control signal generating circuit, the buffer circuit includes at least first, second and third input nodes and one output node, wherein the first input node is connected to the pulse output circuit, the second input node is connected to the control signal generating circuit via a first gate control signal line, and the third input node is connected to the control signal generating circuit via a second gate control signal line, wherein the output node is connected to each of the plurality of gate signal lines, and wherein a potential of one of the plurality of source signal lines is changed while none of the plurality of the gate signal lines is selected.

4. An electronic apparatus comprising the display device according to claim 3.

5. A display device comprising:

a pixel region including a plurality of pixels, a source driver, a first gate driver, a second gate driver, a plurality of gate signal lines, a plurality of source signal lines, and a control signal generating circuit, wherein each of the plurality of pixels includes a light-emitting element, a first transistor for controlling video signal input to the pixel, a second transistor for controlling whether the light-emitting element emits light or not, and a capacitor for holding the video signal, wherein each of the plurality of gate signal lines is electrically connected to the first gate driver and the second gate driver, and each of the plurality of source signal lines is electrically connected to the source driver, wherein the source driver includes a pulse output circuit, a latch circuit, and a selection circuit which operates based on a source control signal outputted from the control signal generating circuit, and wherein each of the first gate driver and the second gate driver includes a pulse output circuit, and a buffer circuit which operates based on a gate control signal and a pulse-width control signal both outputted from the control signal generating circuit, and wherein a potential of one of the plurality of source signal lines is changed while none of the plurality of the gate signal lines is selected.

6. An electronic apparatus comprising the display device according to claim 5.

7. A display device comprising:

a pixel region including a plurality of pixels, a source driver, a first gate driver, a second gate driver, a plurality of gate signal lines, a plurality of source signal lines, and a control signal generating circuit, wherein each of the plurality of pixels includes a light-emitting element, a first transistor for controlling video signal input to the pixel, a second transistor for controlling whether the light-emitting element emits light or not, and a capacitor for holding the video signal, wherein each of the plurality of gate signal lines is electrically connected to the first gate driver and the second gate driver, and each of the plurality of source signal lines is electrically connected to the source driver, wherein the source driver includes a pulse output circuit, a latch circuit, and a selection circuit which operates based on a source control signal outputted from the control signal generating circuit, and wherein each of the first gate driver and the second gate driver includes a pulse output circuit, and a buffer circuit which operates based on a gate control signal and a pulse-width control signal both outputted from the control signal generating circuit, the buffer circuit includes at least first, second and third input nodes and one output node, wherein the first input node is connected to the pulse output circuit, the second input node is connected to the control signal generating circuit via a gate control signal line, and the third input node is connected to the control signal generating circuit via a pulse-width control signal line, and wherein the output node is connected to each of the plurality of gate signal lines, and wherein a potential of one of the plurality of source signal lines is changed while none of the plurality of the gate signal lines is selected.

8. An electronic apparatus comprising the display device according to claim 7.

9. The display device according to claim 1, wherein the light emitting element is an electro luminescence element.

10. The display device according to claim 3, wherein the light emitting element is an electro luminescence element.

11. The display device according to claim 5, wherein the light emitting element is an electro luminescence element.

12. The display device according to claim 7, wherein the light emitting element is an electro luminescence element.

13. The display device according to claim 1, wherein the light emitting element comprises an organic material.

14. The display device according to claim 3, wherein the light emitting element comprises an organic material.

15. The display device according to claim 5, wherein the light emitting element comprises an organic material.

16. The display device according to claim 7, wherein the light emitting element comprises an organic matenal.

* * * * *